United States Patent
Taniguchi et al.

(10) Patent No.: US 12,115,706 B2
(45) Date of Patent: Oct. 15, 2024

(54) MOLDED ARTICLE, ELECTRICAL PRODUCT AND METHOD FOR PRODUCING MOLDED ARTICLE

(71) Applicant: NISSHA CO., LTD., Kyoto (JP)

(72) Inventors: Chuzo Taniguchi, Kyoto (JP); Ryomei Omote, Kyoto (JP); Eiji Kawashima, Kyoto (JP); Junichi Shibata, Kyoto (JP); Jun Sasaki, Kyoto (JP); Yoshihiro Sakata, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 268 days.

(21) Appl. No.: 17/796,739

(22) PCT Filed: Jan. 22, 2021

(86) PCT No.: PCT/JP2021/002273
§ 371 (c)(1),
(2) Date: Aug. 1, 2022

(87) PCT Pub. No.: WO2021/157391
PCT Pub. Date: Aug. 12, 2021

(65) Prior Publication Data
US 2023/0075178 A1    Mar. 9, 2023

(30) Foreign Application Priority Data
Feb. 6, 2020    (JP) ................... 2020-018729

(51) Int. Cl.
*B29C 45/14* (2006.01)
*B29C 33/14* (2006.01)
(Continued)

(52) U.S. Cl.
CPC ........ *B29C 45/14467* (2013.01); *B29C 33/14* (2013.01); *B29C 45/26* (2013.01);
(Continued)

(58) Field of Classification Search
CPC ............. B29C 45/14467; B29C 45/26; B29C 2045/14122; B29C 2045/14139; B29C 33/14; H05K 5/00
See application file for complete search history.

(56) References Cited

U.S. PATENT DOCUMENTS 6,065,951 A * 5/2000 Lemke ................. H01R 12/716
425/123
6,153,140 A * 11/2000 Hirai ....................... B29C 33/14
425/129.1
(Continued)

FOREIGN PATENT DOCUMENTS

JP   S6360512   * 11/1988
JP   H07106733  * 4/1995
(Continued)

OTHER PUBLICATIONS

International Search Report for PCT/JP2021/002273 dated Apr. 6, 2021.
(Continued)

*Primary Examiner* — Edmund H Lee
(74) *Attorney, Agent, or Firm* — Millen, White, Zelano & Branigan P.C.; William F. Nixon

(57) ABSTRACT

A molded article or an electrical product facilitates layout of a wiring line from an electrical circuit of a circuit film integrally molded with a molded body to a connection terminal. The molded article includes a circuit film and a molded body. The circuit film includes an insulating film and an electrical circuit. The molded body is integrally molded with the circuit film. The circuit film includes a flexible wiring portion. The molded body has a through-hole that penetrates from a first main surface to a second main surface. In the flexible wiring portion, a connection terminal
(Continued)

is arranged at a position of passing through the through-hole and beyond the second main surface.

18 Claims, 32 Drawing Sheets

(51) Int. Cl.
    *B29C 45/26*     (2006.01)
    *H05K 5/00*     (2006.01)

(52) U.S. Cl.
    CPC ...... *H05K 5/00* (2013.01); *B29C 2045/14122* (2013.01); *B29C 2045/14139* (2013.01)

(56) References Cited

U.S. PATENT DOCUMENTS

| | | | |
|---|---|---|---|
| 10,225,943 B2 * | 3/2019 | Kanemaki | H01Q 1/243 |
| 10,383,234 B2 | 8/2019 | Yamazaki et al. | |
| 10,710,288 B2 | 7/2020 | Yamazaki et al. | |
| 2018/0228032 A1 | 8/2018 | Yamazaki et al. | |
| 2020/0101646 A1 | 4/2020 | Yamazaki et al. | |

FOREIGN PATENT DOCUMENTS

| | | | | |
|---|---|---|---|---|
| JP | 2012011691 A | | 1/2012 | |
| JP | 2016139929 A | | 8/2016 | |
| JP | 2016196154 A | | 11/2016 | |
| JP | 2017217871 A | | 12/2017 | |
| JP | 2019028928 A | | 2/2019 | |
| KR | 1053336 | * | 8/2011 | |
| WO | WO9723930 | * | 7/1997 | |
| WO | WO2019026636 | * | 2/2019 | |
| WO | WO2021075125 | * | 4/2021 | |

OTHER PUBLICATIONS

English Abstract of JP2012011691, Publication Date: Jan. 19, 2012.
English Abstract of JP2016196154, Publication Date: Nov. 24, 2016.

* cited by examiner

MOLDED ARTICLE, ELECTRICAL PRODUCT AND METHOD FOR PRODUCING MOLDED ARTICLE

TECHNICAL FIELD

The present invention relates to a molded article in which a circuit film is integrally molded with a molded body, an electrical product provided with the molded article, and a method for manufacturing a molded article.

BACKGROUND ART

A component module described in Patent Document 1 (JP 5484529 B) is, for example, a molded article in which a touch sensor as a circuit film and a resin portion as a molded body are integrally molded. The component module of Patent Document 1 includes a flexible printed board for electrical connection between an electrical device located outside the component module and the touch sensor. By connecting an external connection terminal of the flexible printed board to the electrical device, the touch sensor and the electrical device are electrically connected via the flexible printed board.

CITATION LIST

Patent Literature

Patent Document 1: JP 5484529 B

SUMMARY OF INVENTION

Technical Problem

However, in the component module described in Patent Document 1, the resin portion is molded by injection molding using molds, and thus the flexible printed board is drawn out of the resin portion from an end portion of the resin portion.

As in the component module described in Patent Document 1, when the flexible printed board is drawn out from the end portion of the resin portion, handling of the flexible printed board is bothered in some cases. For example, there may be a case where the component module is used for a portion of a component of a chassis of an electrical product and the electrical device connected to the touch sensor is stored in an interior space of the chassis of the electrical product.

In this case, to guide the external connection terminal of the flexible printed board to the interior space of the electrical product, for example, a clearance through which the flexible printed board is passed is required to be provided between the end portion of the component module and another portion of the chassis around it. In a case where the flexible printed board is caused to pass through the clearance and go around from the outside of the housing to the inside of the housing, for example, the flexible printed board interferes with the housing and the flexible printed board is broken, and thus breaking a wiring line. Due to the interference of the flexible printed board with the housing and the breakage of the wiring line, a problem, such as damage of a flexible wiring substrate, occurs.

An object of the present invention is to provide a molded article or an electrical product that facilitates layout of a wiring line from an electrical circuit of a circuit film integrally molded with a molded body to a connection terminal. An object of the present invention is to provide a method for manufacturing the molded article.

Solution to Problem

Some aspects will be described below as means to solve the problems. These aspects can be combined arbitrarily as necessary.

A molded article according to one aspect of the present invention includes a circuit film and a molded body. The circuit film includes a thermoplastic insulating film and an electrical circuit formed on the insulating film. The molded body has one main surface and another main surface opposed to the one main surface. The circuit film integrally molded with the circuit film located on the one main surface includes a flexible wiring portion formed by cutting a periphery of a wiring line connected to the electrical circuit while maintaining connection with the insulating film. The molded body has a through-hole that penetrates from the one main surface to the other main surface. In the flexible wiring portion, a connection terminal is arranged in the through-hole or at a position of passing through the through-hole and beyond the other main surface.

The molded article including such a configuration includes the circuit film on the one main surface of the molded body and the flexible wiring portion passing through the through-hole from the one main surface to the other main surface of the molded body. When, for example, the electrical device is connected to the connection terminal of the flexible wiring portion, the circuit film on the side of the one main surface of the molded body and the electrical device on the side of the other main surface can be connected by the flexible wiring portion passing through the through-hole.

A molded article according to another aspect of the present invention includes a circuit film, a flexible wiring portion, and a molded body. The circuit film includes an insulating film and an electrical circuit formed on the insulating film. The flexible wiring portion is formed of a thermoplastic flexible printed board separated from the circuit film and connected to the electrical circuit. The molded body has one main surface and another main surface opposed to the one main surface. The molded body is integrally molded with both of the circuit film located on the one main surface and the flexible wiring portion. The molded body has a through-hole that penetrates from the one main surface to the other main surface. In the flexible wiring portion, a connection terminal is arranged in the through-hole or at a position of passing through the through-hole and beyond the other main surface.

The molded article including such a configuration includes the circuit film on the one main surface of the molded body and the flexible wiring portion passing through the through-hole from the one main surface to the other main surface of the molded body. When, for example, the electrical device is connected to the connection terminal of the flexible wiring portion, the circuit film on the side of the one main surface of the molded body and the electrical device on the side of the other main surface can be connected by the flexible wiring portion passing through the through-hole.

The molded article described above may include a three-dimensional component arranged in the through-hole and separated from the molded body. With the molded article configured in this manner, the three-dimensional component shares the through-hole with the flexible wiring portion, and reduction in strength of the molded article is suppressed compared to a case where a dedicated hole is separately provided for the three-dimensional component.

The molded article described above may include a three-dimensional component that covers the through-hole and is separated from the molded body. The molded article configured in this manner hides the through-hole with the three-dimensional component, thus improving designability of appearance. Closing the through-hole with the three-dimensional component allows preventing, for example, a foreign matter, such as dust and water content, from entering the side of the other main surface of the molded body through the through-hole.

In the molded article described above, the flexible wiring portion may be fixedly secured to a wall surface of the through-hole. In the molded article configured in this manner, a change in position of the flexible wiring portion is suppressed compared to a case where the flexible wiring portion is not fixedly secured to the wall surface of the through-hole, thereby facilitating connection of the flexible wiring portion to the connection terminal.

An electrical product according to one aspect of the present invention includes a chassis including the molded article described above and an electrical device. An electrical device is arranged in the chassis and connected to the connection terminal of the flexible wiring portion. The molded article is mounted with the one main surface facing an outside of the chassis and the other main surface facing an inside of the chassis.

The electrical product configured in this manner can connect the electrical device inside the housing and the electrical circuit by the flexible wiring portion passing through the through-hole of the molded article from the one main surface of the molded article facing outside the housing. Therefore, a defect, such as an interference of the flexible wiring portion with the housing and bending of the flexible wiring portion due to layout of the flexible wiring portion can be prevented.

A method for manufacturing a molded article according to one aspect of the present invention includes: (a) pre-forming a circuit film that includes a thermoplastic insulating film and an electrical circuit formed on the insulating film: (b) setting the circuit film in a first mold: (c) clamping the first mold and a second mold; and (d) injecting a molten material into a cavity of the first mold and the second mold to form a molded body integrally molded with the circuit film. In (a), a thermoplastic flexible wiring portion formed by cutting a periphery of a wiring line connected to the electrical circuit while maintaining connection with the insulating film is stood in a direction intersecting with an in-plane direction of the circuit film. In (b), at least a portion of the flexible wiring portion is arranged on a side surface of a projection of the first mold. In (c), the projection of the first mold is fitted to a recessed portion of the second mold, and a connection terminal of the flexible wiring portion is sandwiched between the first mold and the second mold in the recessed portion. In (d), a through-hole is provided in the molded body with the projection and the circuit film and the molded body are integrally molded such that the flexible wiring portion is arranged in the through-hole without the connection terminal in contact with a molten material.

In the method for manufacturing a molded article configured in this manner, a case where, for example, the electrical device is connected to the connection terminal of the flexible wiring portion is considered. The flexible wiring that connects the circuit film on one side of the through-hole of the molded article and the electrical device on the other side can be arranged in the through-hole. Furthermore, during integral molding of the circuit film and the molded body, since the molten material does not come into contact with the connection terminal of the flexible wiring portion, poor connection between the circuit film and the electrical device due to poor connection in the connection terminal can be suppressed.

A method for manufacturing a molded article according to another aspect of the present invention includes: (a) pre-forming a circuit film that includes a thermoplastic insulating film and an electrical circuit formed on the insulating film: (b) setting the circuit film in a first mold: (c) clamping the first mold and a second mold; and (d) injecting a molten material into a cavity of the first mold and the second mold to form a molded body integrally molded with the circuit film. In (a), a thermoplastic flexible wiring portion formed of a flexible printed board, connected to the electrical circuit, and separated from the circuit film is stood in a direction intersecting with an in-plane direction of the circuit film. In (b), at least a portion of the flexible wiring portion is arranged on a side surface of a projection of the first mold. In (c), the projection of the first mold is fitted to a recessed portion of the second mold, and a connection terminal of the flexible wiring portion is sandwiched between the first mold and the second mold in the recessed portion. In (d), a through-hole is provided in the molded body with the projection and the circuit film and the molded body are integrally molded such that the flexible wiring portion is arranged in the through-hole without the connection terminal in contact with a molten material.

In the method for manufacturing a molded article configured in this manner, a case where, for example, the electrical device is connected to the connection terminal of the flexible wiring portion is considered. The flexible wiring that connects the circuit film on one side of the through-hole of the molded article and the electrical device on the other side can be arranged in the through-hole. Furthermore, during integral molding of the circuit film and the molded body, since the molten material does not come into contact with the connection terminal of the flexible wiring portion, poor connection between the circuit film and the electrical device due to poor connection in the connection terminal can be suppressed.

Advantageous Effects of Invention

The molded article or the electrical product including the molded article according to the present invention facilitates layout of the wiring line from the electrical circuit of the circuit film integrally molded with the molded body to the connection terminal. The method for manufacturing a molded article according to the present invention allows easily manufacturing the molded article that facilitates layout of the wiring line from the electrical circuit of the circuit film integrally molded with the molded body to the connection terminal.

DESCRIPTION OF EMBODIMENTS

First Embodiment

(1) Overall Configuration

Figure 1:
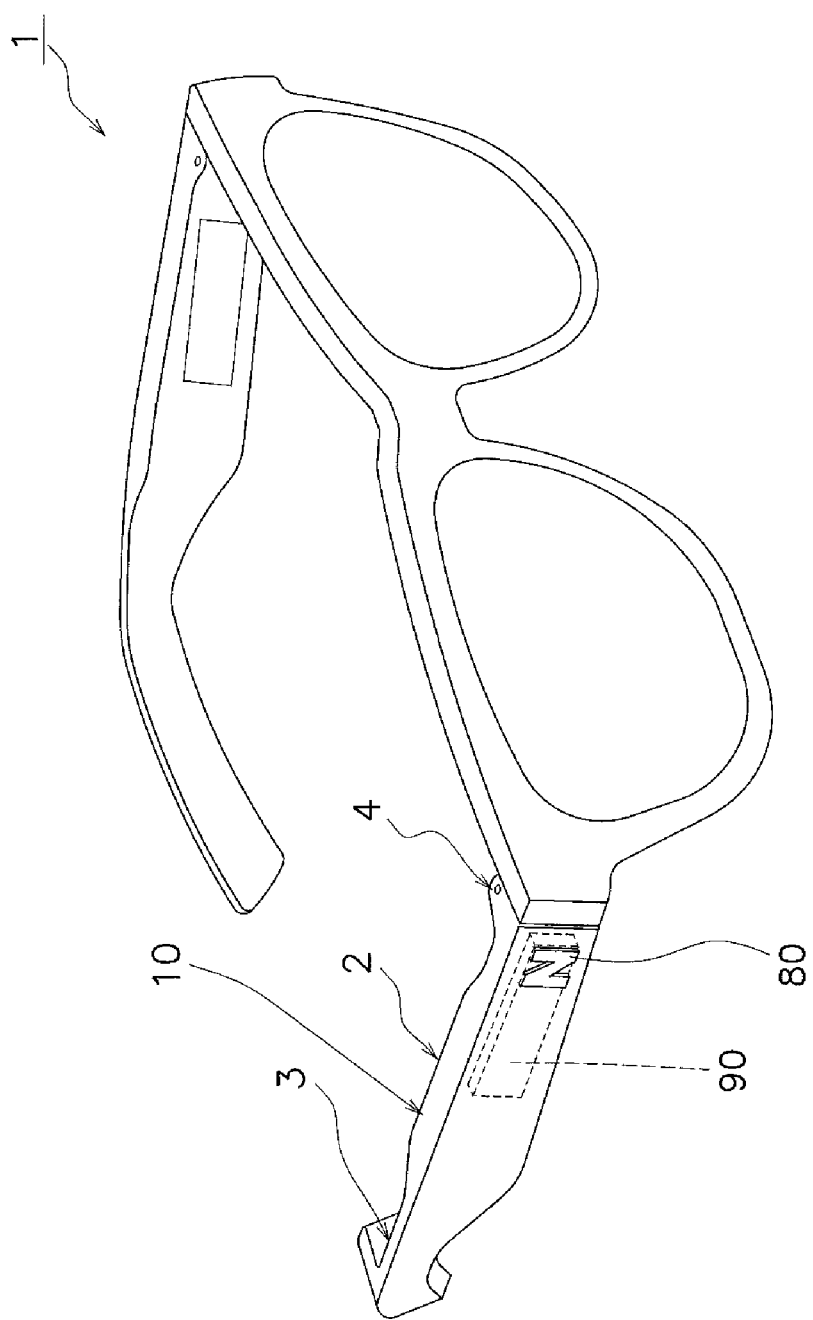
FIG. 1 is a perspective view illustrating an appearance of eyeglasses to which a molded article is applied.

FIG. 1 illustrates eyeglasses to which a molded article according to the first embodiment of the present invention is applied. In eyeglasses 1 illustrated in FIG. 1, a portion of tips 3, temples 2, and hinges 4 that are put on ears are molded articles 10. A space for housing an electrical device 90 is provided inside the molded article 10.

Figure 2:
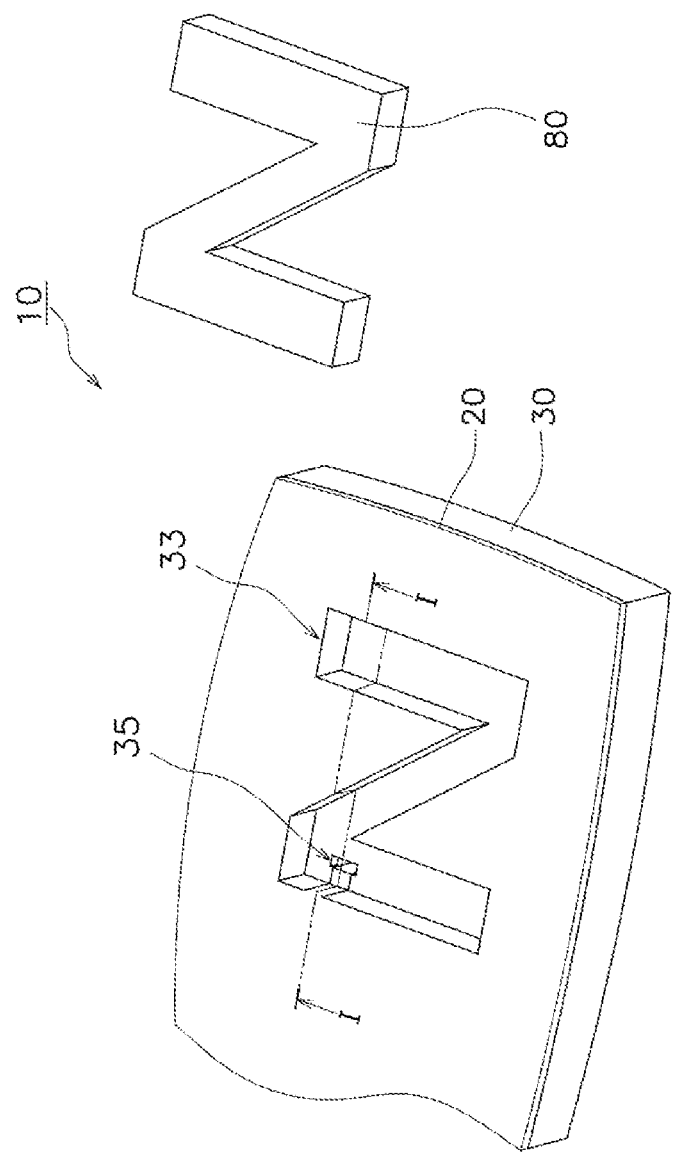
FIG. 2 is a partially enlarged perspective view enlarging a through-hole and a periphery thereof of the molded article according to a first embodiment.

The molded article 10 includes a circuit film 20 and a molded body 30 illustrated in FIG. 2. The circuit film 20 is integrally molded with the molded body 30.

FIG. 2 illustrates a portion of the enlarged molded body 30. The part illustrated in FIG. 2 is a portion of the temple 2 of the eyeglasses 1 and a part where a fitted portion 33 in which the letter "N" is engraved is arranged. A through-hole 35 communicates with the inside of the fitted portion 33. To the fitted portion 33, a three-dimensional component 80 having the shape of the letter "N" is fitted. The through-hole 35 is covered with the three-dimensional component 80. Therefore, the through-hole 35 is hidden from the outside by the three-dimensional component 80. Therefore, the three-dimensional component 80 improves designability of the molded article 10 and also prevents intrusion of dust into the molded article 10 through the through-hole 35.

Figure 3:
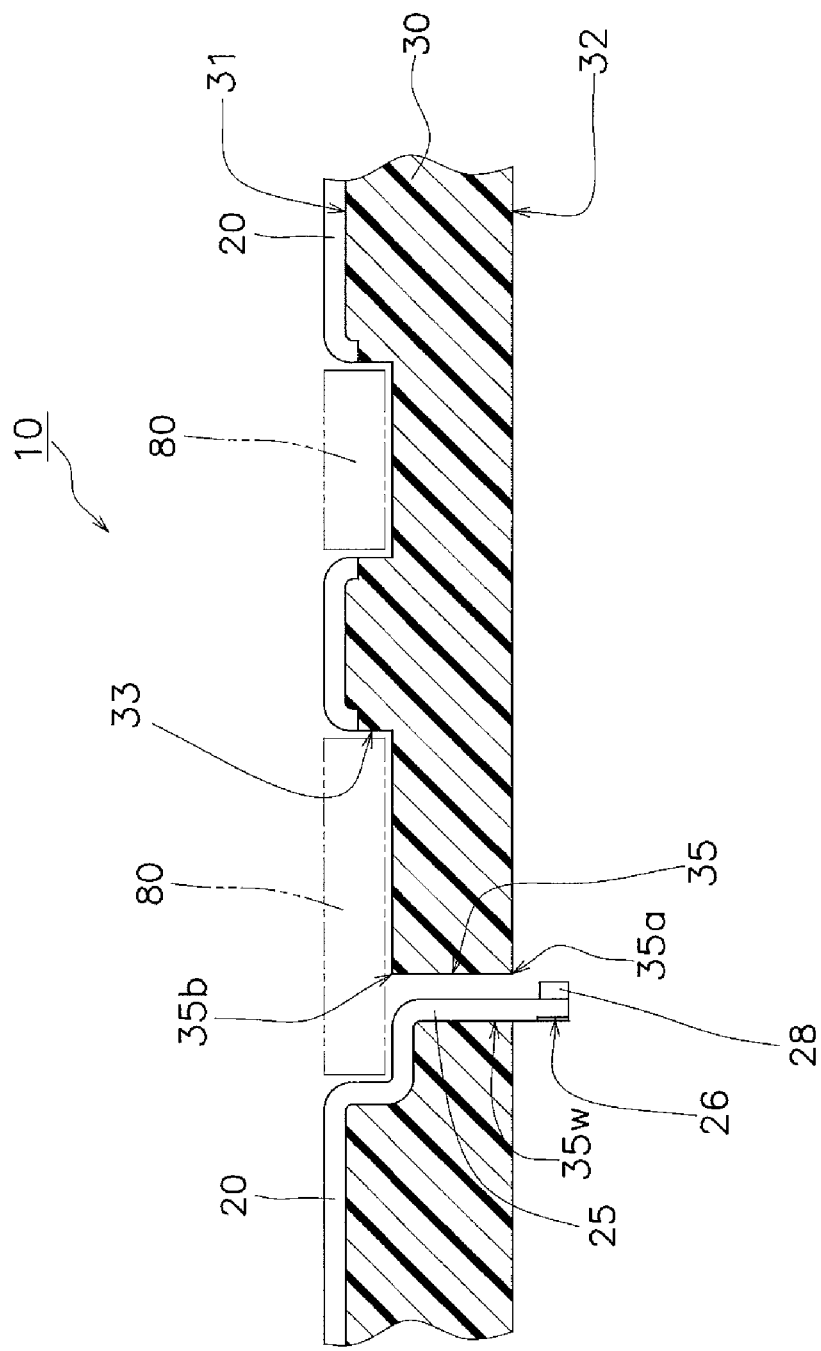
FIG. 3 is a cross-sectional view of the molded article taken along line I-I in FIG. 2.

The cross-sectional surface taken along line I-I in FIG. 2 is illustrated in FIG. 3. As illustrated in FIG. 3, the molded body 30 includes one main surface 31 and another main surface 32 opposed to the one main surface 31. The fitted portion 33 is formed on the one main surface 31 of the molded body 30. The molded body 30 is integrally molded with the circuit film 20. The circuit film 20 integrally molded with the molded body 30 is located on the one main surface 31 of the one main surface 31. Note that, FIG. 3 illustrates a case where the one main surface 31 and the other main surface 32 are planes. However, the shapes of the one main surface 31 and the other main surface 32 are not limited to the planes, and may be a curved surface or may be a shape with irregularities.

Figure 4:
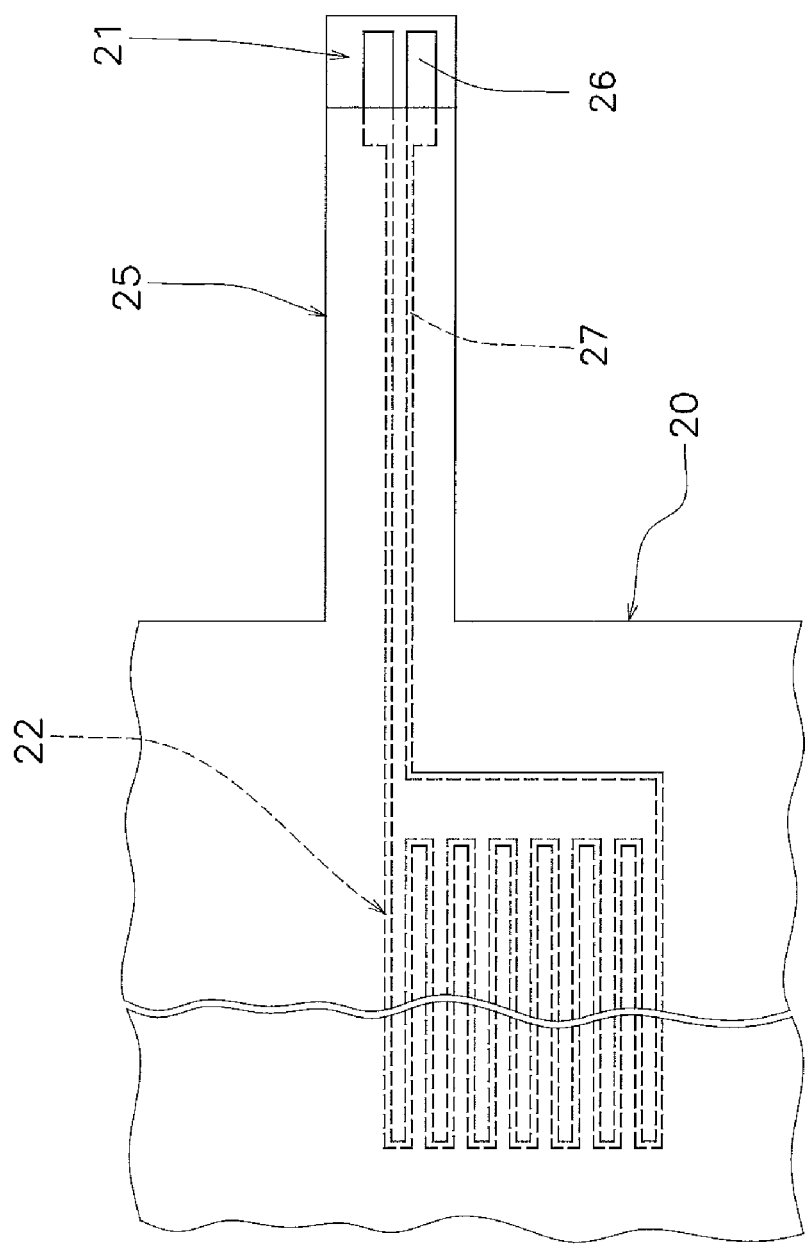
FIG. 4 is a partially enlarged plan view for describing a configuration of a circuit film 20.

As illustrated in FIG. 4, the circuit film 20 includes an insulating film 21 and an electrical circuit 22 formed on the insulating film 21. In this first embodiment, the electrical circuit 22 formed on the circuit film 20 is an antenna.

Figure 5:
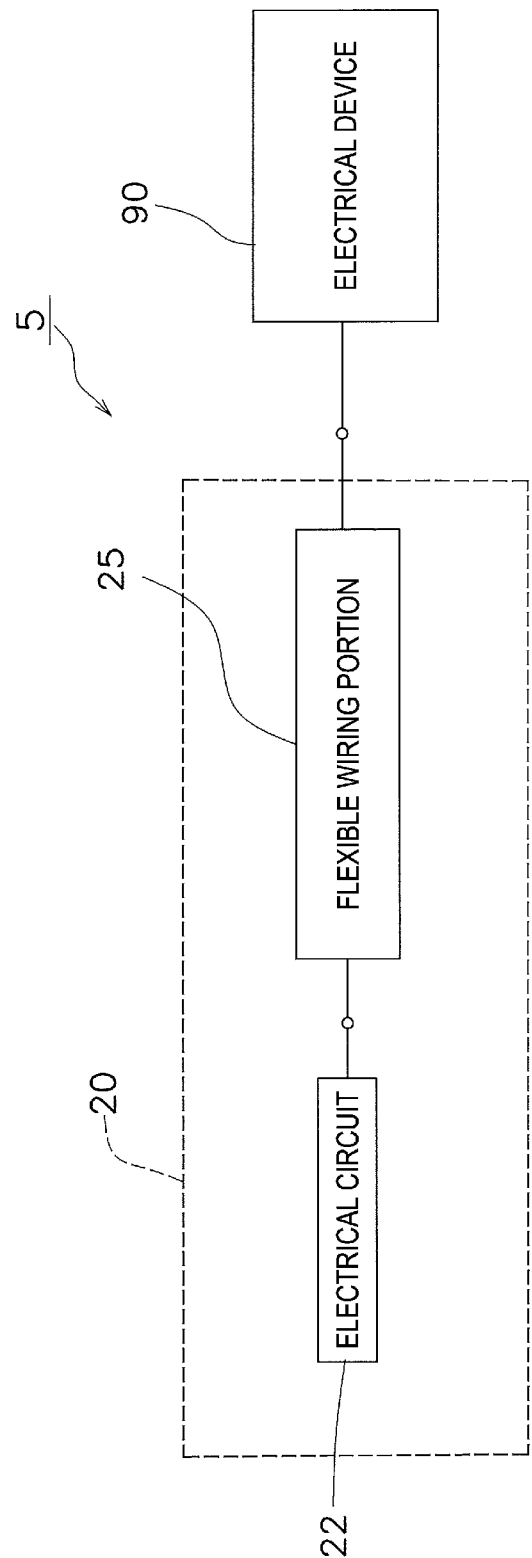
FIG. 5 is a block diagram illustrating a configuration of an electrical product of the first embodiment.

FIG. 5 illustrates an overview of a configuration of an electrical product 5 provided with the eyeglasses 1. The electrical circuit 22 is connected to the electrical device 90 by a flexible wiring portion 25. The flexible wiring portion 25 includes a connection terminal 26 and a wiring line 27 for connecting the electrical circuit 22 and the electrical device 90 (see FIG. 4). The wiring line 27 is electrically connected to the electrical circuit 22 and also electrically connected to the connection terminal 26. The electrical device 90 of the first embodiment has a function to perform transmission and reception with the antenna. The electrical device 90 is, for example, a receiver that converts a received wireless signal into a sound signal and/or a video signal and a transmitter that converts a control signal into a wireless signal and transmits the wireless signal.

The molded body 30 includes the through-hole 35 that penetrates from the one main surface 31 to the other main surface 32 (see FIG. 3). One end 35b of the through-hole 35 is on the fitted portion 33, and another end 35a of the through-hole 35 is on the other main surface 32. In the flexible wiring portion 25, the connection terminal 26 is arranged at a location of passing through the through-hole 35 and beyond the other main surface 32 of the molded body 30. A reinforcing film 28 is provided on a surface of the flexible wiring portion 25 on the side opposite to the position where the connection terminal 26 is arranged.

The portion of the flexible wiring portion 25 passing through the through-hole 35 is fixedly secured to a wall surface 35w of the through-hole 35. Thus, for example, an adhesive layer is arranged at a location where the flexible wiring portion 25 comes into contact with the wall surface 35w.

Figure 6:
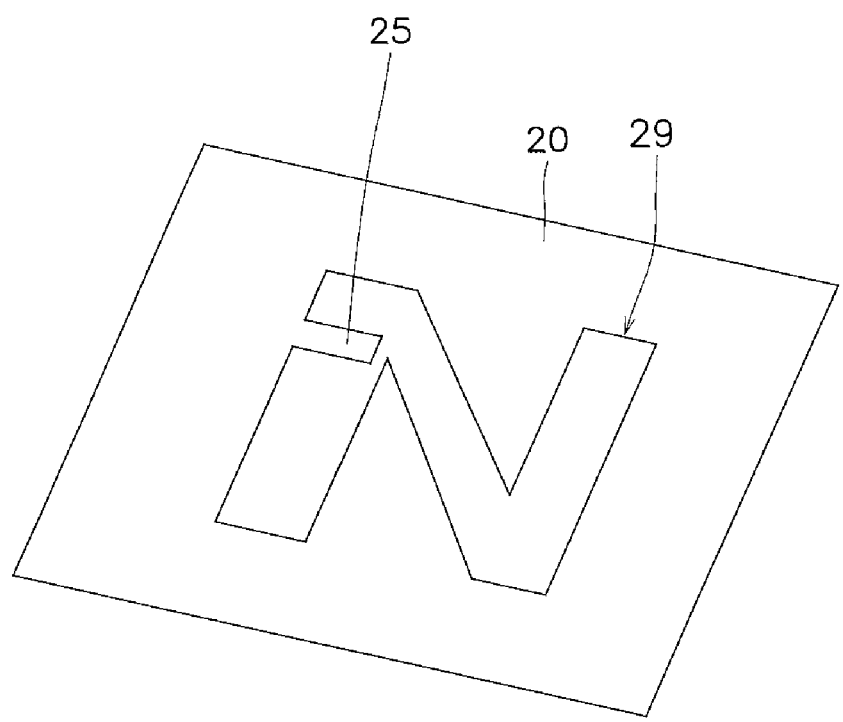
FIG. 6 is a partially enlarged perspective view for describing a formation method of a flexible wiring portion.
Figure 7:
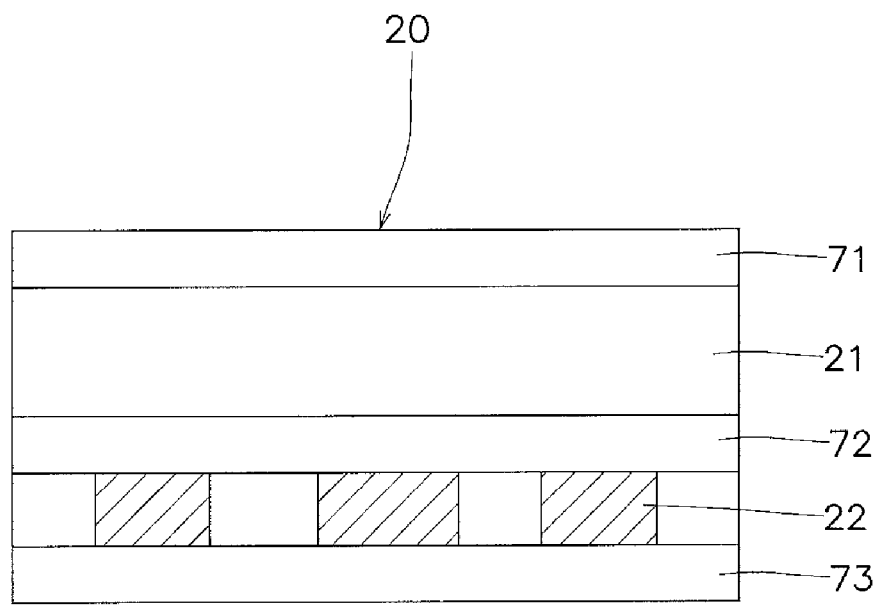
FIG. 7 is a schematic cross-sectional view for describing the configuration of the circuit film 20.

FIG. 6 illustrates a portion of the enlarged circuit film 20. FIG. 7 schematically illustrates a cross-sectional structure of the circuit film 20. In this first embodiment, a graphic layer 71 is formed on a surface on the outer surface of the insulating film 21. Furthermore, a graphic layer 72, the electrical circuit 22, and a protecting layer 73 are formed on a surface on the inner side of the insulating film 21.

The flexible wiring portion 25 provided with the circuit film 20 is formed by cutting the periphery of the wiring line 27 connected to the electrical circuit 22 while maintaining the connection with the insulating film 21. The location illustrated in FIG. 6 is an opening 29 formed by punching the circuit film 20 into an N-shape so as to correspond to the N-shaped fitted portion 33 and the periphery thereof. The flexible wiring portion 25 protrudes from the opening 29.

(2) Detailed Configuration (2-1) Circuit Film 20

As illustrated in FIG. 7, the circuit film 20 includes the thermoplastic insulating film 21, the electrical circuit, the graphic layers 71, 72, and the protecting layer 73.

For example, as the thermoplastic insulating film, a film made of thermoplastic resin, a film made of thermoplastic elastomer, or a stacked film of them can be used. The material of the film made of thermoplastic resin is, for example, a resin film made of a polyester resin, a polyethylene terephthalate (PET) resin, an acrylic resin, a polycarbonate resin, a polybutylene terephthalate (PBT) resin, a triacetyl cellulose resin, a styrene resin, or an ABS resin, a multilayer film made of an acrylic resin and an ABS resin, or a multilayer film made of an acrylic resin and a polycarbonate resin. A thickness of the film made of resin is selected from a range from, for example, 30 μm to 500 μm.

The electrical circuit 22 is formed by, for example, forming a conductive material on the surface(s) of the insulating film 21 and/or the graphic layer 72, and then performing patterning. Alternatively, the electrical circuit 22 is formed by, for example, printing conductive ink on the surface(s) of the insulating film 21 and/or the graphic layer 72 by thick-film printing. Examples of the conductive material constituting the electrical circuit 22 include a metal material and a semiconductor material. As the metal material, for example, copper, aluminum, carbon, nickel, gold, silver, or tin can be used. Examples of the semiconductor material include metal oxide and a conductive polymer. For example, when a touch sensor is provided on a lens portion of the eyeglasses 1 as the electrical circuit 22, a transparent electrode may be used. The transparent electrode is formed of, for example, a metal oxide, a transparent conductive polymer, or a transparent conductive ink. Examples of metal oxides include indium tin oxide (ITO) and indium zinc oxide (IZO). An example of a transparent conductive polymer is poly-3,4-ethylenedioxythiophene/polysulfonic acid (PEDOT/PSS). Examples of transparent conductive ink include carbon nanotubes or silver nanofibers compounded in a binder.

The graphic layers 71, 72 are layers used to express a design, such as a pattern. The graphic layers 71, 72 are formed by, for example, performing gravure printing or screen printing on the insulating film 21. The materials forming the graphic layers 71, 72 contain, for example, a resin, such as an acrylic resin, a vinyl chloride vinyl acetate copolymer resin, a thermoplastic urethane resin, or a polyester resin, and a pigment or dye that is added to the resin. The graphic layers 71, 72 may also have a metallic design formed using, for example, an insulated aluminum paste or mirror ink. Additionally, irregularities may be formed on the graphic layer 71.

The protecting layer 73 is a layer for preventing, for example, oxidation, sulfurization, and a scratch of the electrical circuit 22 of the circuit film 20. The protecting layer 73 is also intended to improve insulating properties of the electrical circuit 22 and the wiring line 27. The protecting layer 73 is formed of a material that can adhere to the molded body 30 when integrally formed. For example, a UV (ultraviolet light) curing resin and a thermosetting resin are used for the protecting layer 73. When the protecting layer 73 is arranged on the side of the molded body 30, the protecting layer 73 may be omitted.

(2-2) Molded Body 30

The molded body 30 may be colored or need not be colored, and is molded using a transparent, translucent, or opaque thermoplastic resin or thermoplastic elastomer. As the material of the molded body 30, a general-purpose thermoplastic resin, such as a polystyrene resin, a polyolefin resin, an ABS resin, or an AS resin is preferably used. Besides, a polycarbonate resin, a polyacetal resin, an acrylic resin, a polybutylene terephthalate resin, an engineering resin (for example, a polysulfone resin, a polyphenylene sulfide resin, a polyphenylene oxide resin, and a polyarylate resin), a polyamide resin, or a urethane, polyester, or styrene thermoplastic elastomer can be used as the material of the molded body 30. For example, a reinforcing material, such as a glass fiber or an inorganic filler, can be added to the molded body 30.

(3) Method for Manufacturing Molded Article 10

First, the flexible wiring portion 25 is formed on the circuit film 20. The circuit film 20 prior to forming the flexible wiring portion 25 illustrated in FIG. 4 has, for example, a rectangular shape without the N-shaped opening 29. The opening 29 is formed, for example, by a punching press. At this time, the portion of the flexible wiring portion 25 is left unpunched. As a result, the flexible wiring portion 25 where the periphery of the wiring line 27 connected to the electrical circuit 22 is cut while the connection with the insulating film 21 is maintained is formed.

Figure 8:
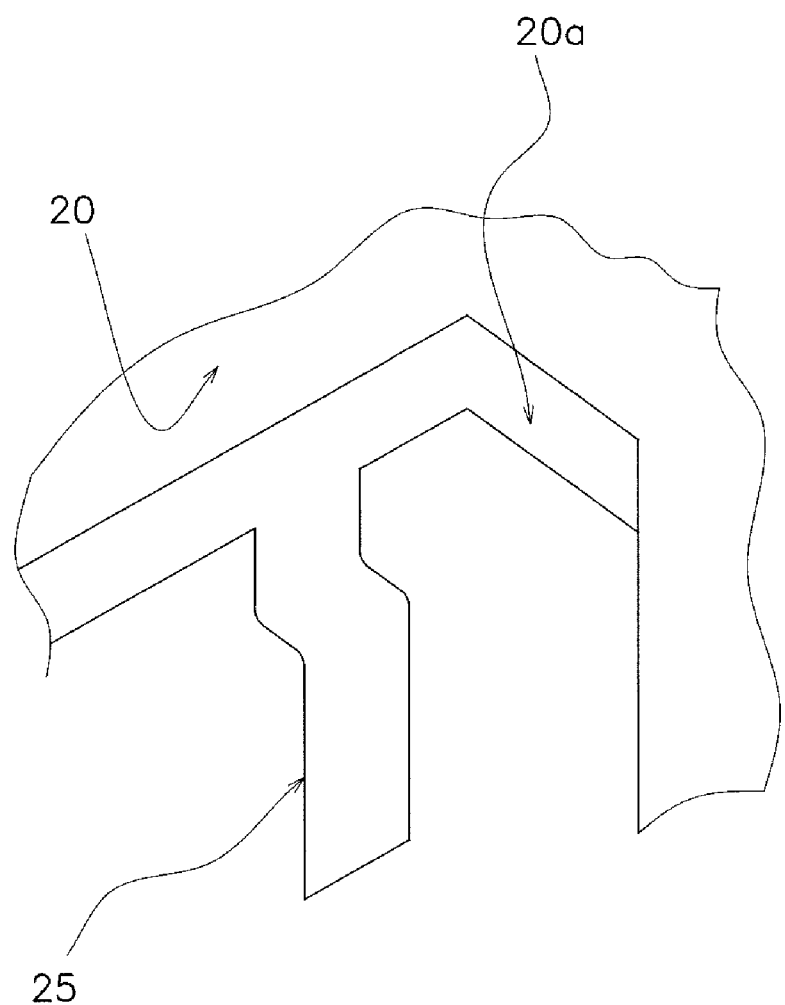
FIG. 8 is a partially enlarged perspective view of a pre-formed circuit film.
Figure 9:
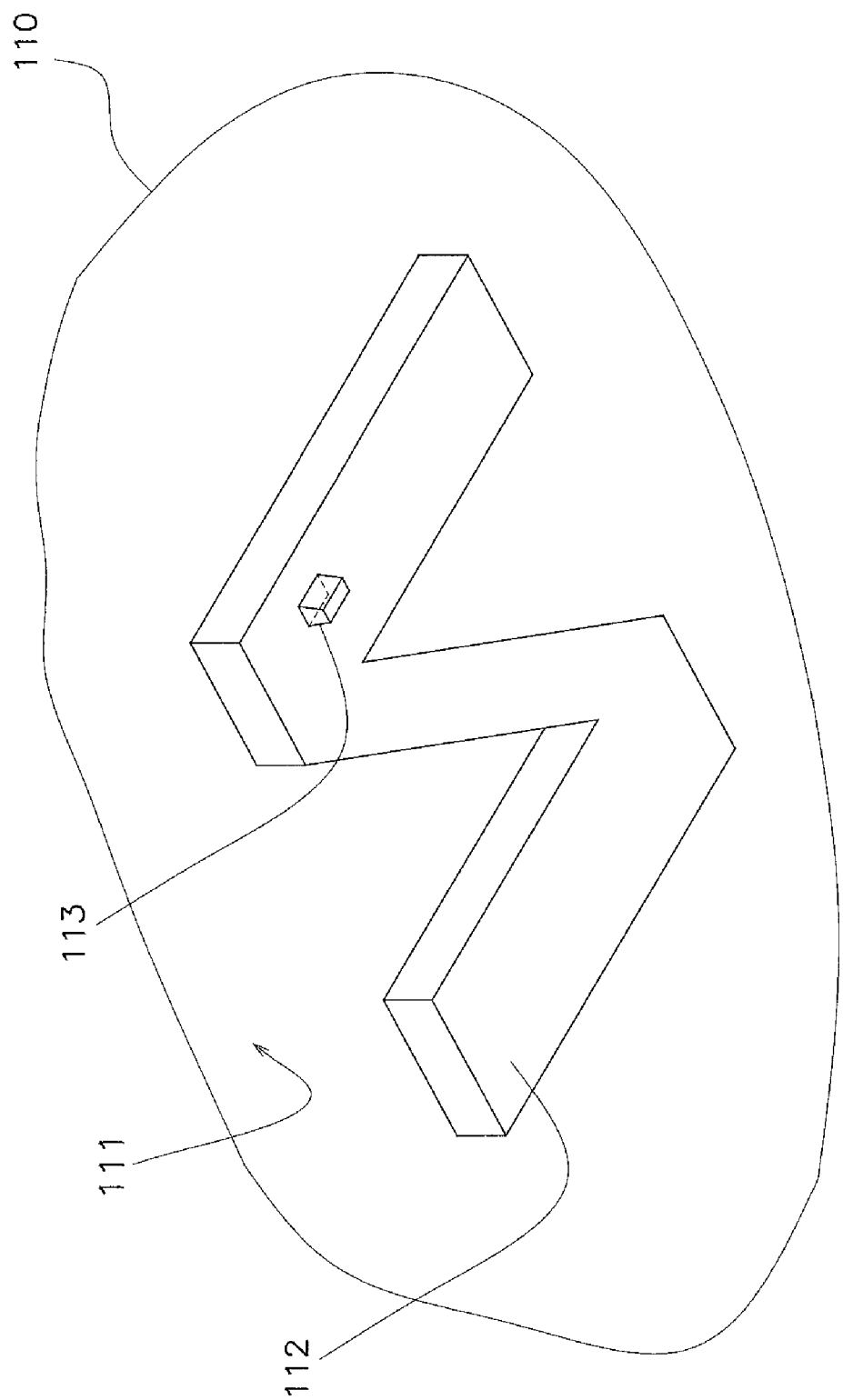
FIG. 9 is a partially enlarged perspective view of a first mold.
Figure 10:
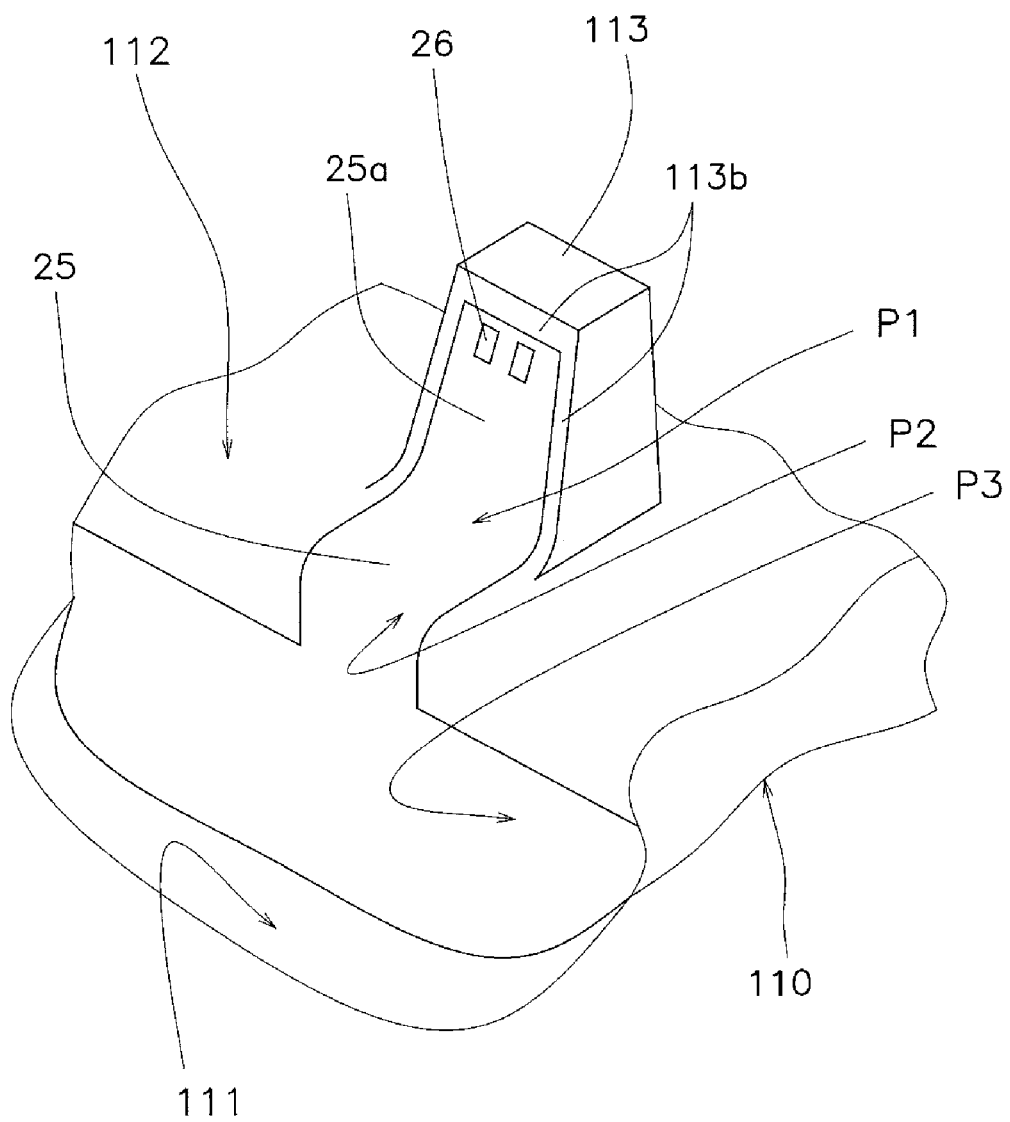
FIG. 10 is a partially enlarged perspective view of a projection of the first mold in which the circuit film is set.

Using the circuit film 20 illustrated in FIG. 6, the circuit film 20 is pre-formed. FIG. 8 illustrates the enlarged flexible wiring portion 25 of the circuit film 20 after pre-forming and the periphery thereof. FIG. 9 illustrates an enlarged N-shaped protrusion 112 in a first mold 110 and the periphery thereof. FIG. 10 illustrates an enlarged projection 113 in the first mold 110.

The N-shaped protrusion 112 in the first mold 110 is a structure for forming the N-shaped fitted portion 33 of the molded body 30. The protrusion 112 is a portion that protrudes toward a cavity Cv on an inner surface 111 of the first mold 110 to form the cavity Cv (see FIG. 11). The projection 113 further protrudes from this protrusion 112. The projection 113 is a structure for forming the through-hole 35 of the molded body 30. FIG. 10 illustrates the flexible wiring portion 25 arranged along the projection 113.

In pre-forming, the flat circuit film 20 is processed into a three-dimensional shape as illustrated in FIG. 8, for example, by a hot press. The flexible wiring portion 25 is further bent twice from a location 20a, which is bent so as to run along the side surface of the N-shaped fitted portion 33. The reason that the flexible wiring portion 25 is bent twice is that a portion of the flexible wiring portion 25 is arranged so as to pass through the inside of the through-hole 35 after running along the bottom surface of the N-shaped fitted portion 33.

The pre-formed circuit film 20 is set in the first mold 110. In the circuit film 20, at least a portion of the flexible wiring portion 25 is arranged on a side surface 113a (see FIG. 11) of the projection 113 of the first mold 110. Here, a distal end portion 25a of the flexible wiring portion 25 is arranged along the side surface 113a of the projection 113. The side surface 113a is inclined at 0.5 degrees or more with respect to a movement direction of the first mold 110 such that the projection 113 can be removed from the molded body 30 after molding the molded body 30. This distal end portion 25a is a portion including the connection terminal 26. Positions P1, P2, P3 (see FIG. 10) where the circuit film 20 is bent are preferably curved surfaces to prevent the wiring line 27 from being damaged.

The periphery of the distal end portion 25a of the flexible wiring portion 25 is surrounded by a rib 113b of the projection 113. The rib 113b is a portion projecting from the side surface 113a. The rib 113b prevents a molten material from entering between the side surface 113a and the flexible wiring portion 25. Note that the rib 113b may be omitted in some cases. The molten material includes, for example, a molten resin and a molten elastomer.

Figure 11:
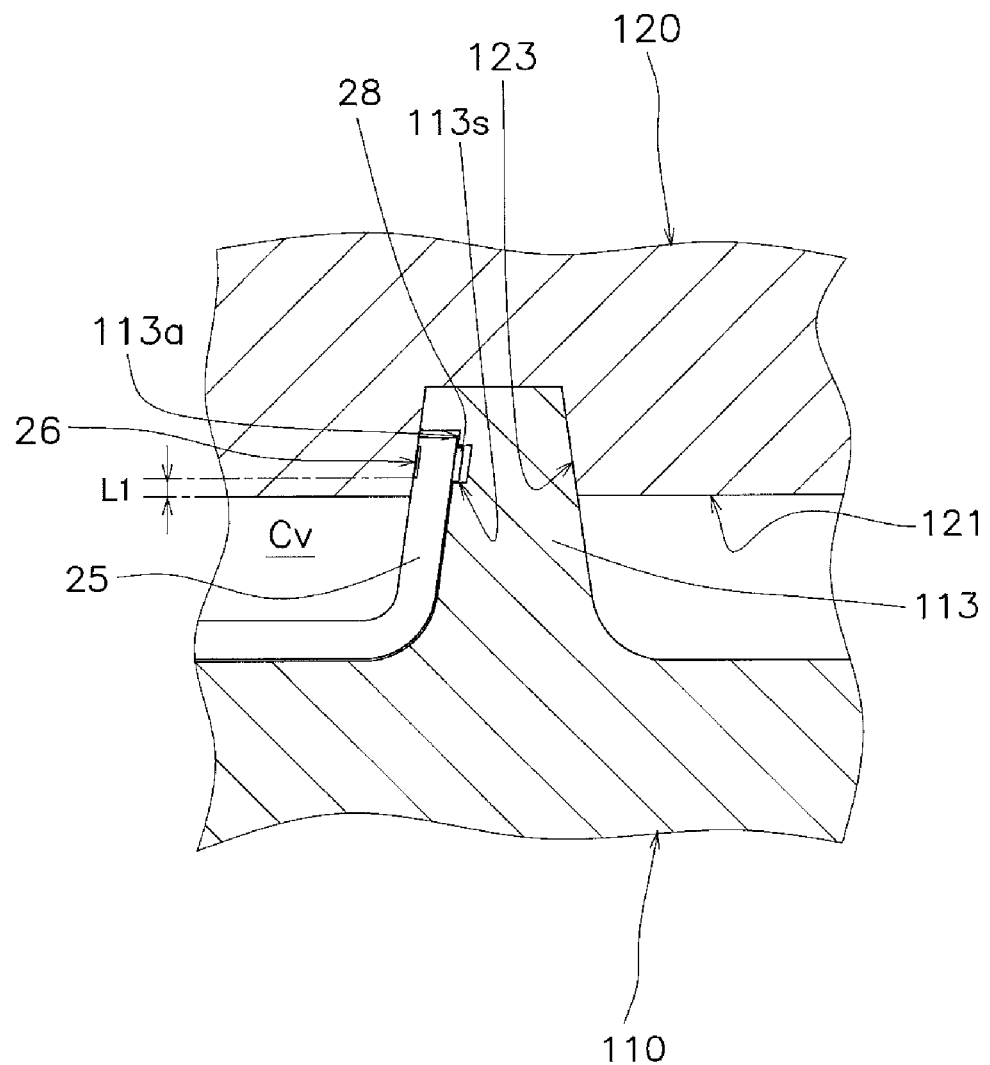
FIG. 11 is a partially enlarged cross-sectional view of the first mold and a second mold in which the circuit film is set.

Next, as illustrated in FIG. 11, the first mold 110 and a second mold 120 are clamped. In this clamping step, the projection 113 of the first mold 110 fits to a recessed portion 123 of the second mold 120. The recessed portion 123 is a portion recessed on the side opposite to the cavity Cv in an inner surface 121 of the second mold 120 to form the cavity Cv. By fitting the projection 113 of the first mold 110 to the recessed portion 123 of the second mold 120, the connection terminal 26 of the flexible wiring portion 25 is sandwiched between the first mold 110 and the second mold 120 in the recessed portion 123.

After clamping, the molten material is injected into the cavity Cv formed by the first mold 110 and the second mold 120. This molten material is solidified in the cavity Cv to form the molded body 30. Simultaneously with solidifying the molten material, the molded body 30 and the circuit film 20 are integrated. In the step of forming the molded body 30, the through-hole 35 is provided in the molded body 30 with the projection 113. At this time, since the distal end portion 25a of the flexible wiring portion 25 is arranged along the side surface 113a of the projection 113, the flexible wiring portion 25 is arranged in the through-hole 35. In this way, the connection terminal 26 sandwiched between the first mold 110 and the second mold 120 does not come into contact with the molten material injected into the cavity Cv when the circuit film 20 and the molded body 30 are integrally molded. A distance L1 from a recessed portion 113s that houses the reinforcing film 28 to the inner surface 121 of the second mold 120 is preferably, for example, 2 mm or more.

Second Embodiment

In the first embodiment, the flexible wiring portion 25 is formed as a portion of the circuit film 20. However, a flexible wiring board separated from the circuit film 20 can be used for the flexible wiring portion.

(4) Overall Configuration

The molded article according to the second embodiment can also have the configuration similar to that of the molded article 10 illustrated in FIG. 1. Here, in the second embodiment as well, the molded article 10 as a portion of the tip 3, the temple 2, and the hinge 4 of the eyeglasses 1 will be described as an example.

Figure 12:
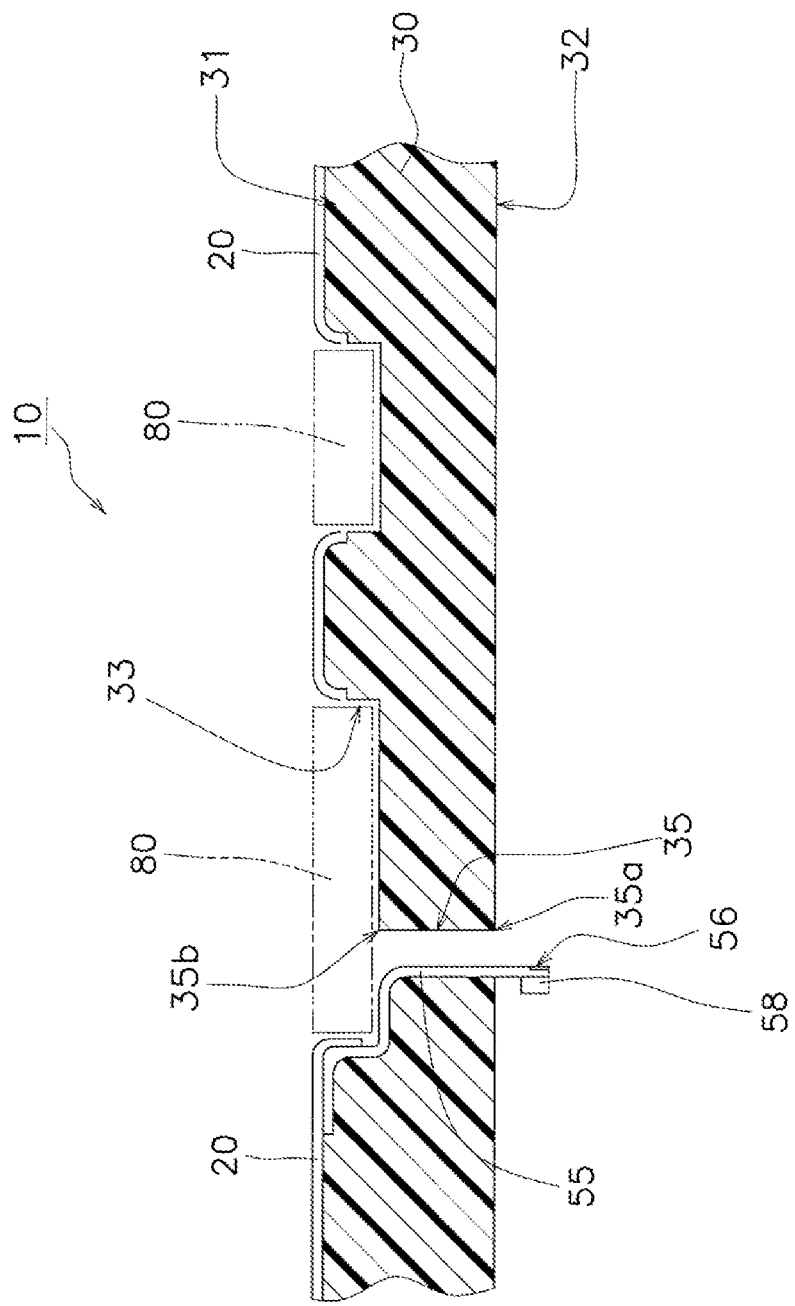
FIG. 12 is a partially enlarged perspective view enlarging a through-hole and a periphery thereof of a molded article according to a second embodiment.

As illustrated in FIG. 12, the molded body 30 includes the one main surface 31 and the other main surface 32 opposed to the one main surface 31. The fitted portion 33 is formed on the one main surface 31 of the molded body 30. The molded body 30 is integrally molded with the circuit film 20 and a flexible wiring portion 55, which is a flexible printed wiring board. The circuit film 20 integrally molded with the molded body 30 is located on the one main surface 31 of the one main surface 31.

Figure 13:
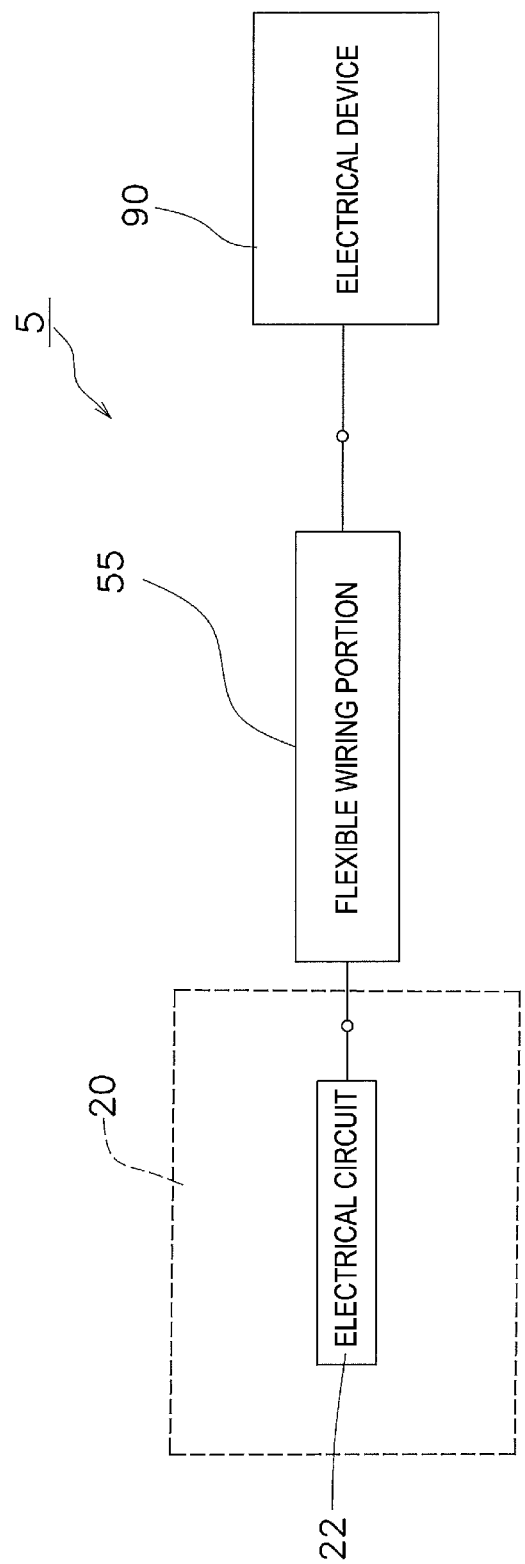
FIG. 13 is a block diagram illustrating a configuration of an electrical product of the second embodiment.

Similarly to the first embodiment, the circuit film 20 includes the insulating film 21 and the electrical circuit 22 formed on the insulating film 21. In the second embodiment, the electrical circuit 22 formed on the circuit film 20 is an antenna. In the electrical product 5 of the second embodiment, the flexible wiring portion 55 connects the electrical circuit 22 of the circuit film 20 and the electrical device 90. As the electrical device 90 of the second embodiment illustrated in FIG. 13, one similar to the electrical device 90 of the first embodiment illustrated in FIG. 5 can be used.

Figure 14:
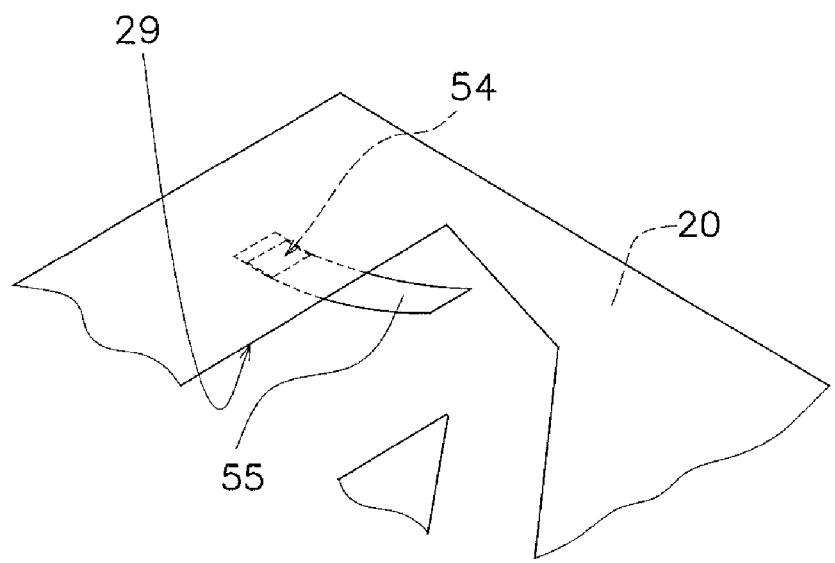
FIG. 14 is a partially enlarged perspective view illustrating a flexible wiring portion connected to a circuit film.

FIG. 14 illustrates a portion of the enlarged circuit film 20 connected to the flexible wiring portion 55. A flexible wiring board conventionally available can be used for the flexible wiring board applied to the flexible wiring portion 55. The flexible wiring board can be constituted by, for example, using an insulating film, a wiring line, and a protecting layer made of the same material as that used for the circuit film 20. As the cross-sectional structure of the circuit film 20 of the second embodiment, for example, the same configuration as the cross-sectional structure of the circuit film of the first embodiment can be used. The flexible wiring board applied to the flexible wiring portion 55 and the electrical circuit 22 of the circuit film 20 can be connected by, for example, an anisotropic conductive film 54. The electrical circuit 22 and the flexible wiring portion 55 may be connected by solder.

The molded body 30 includes the through-hole 35 that penetrates from the one main surface 31 to the other main surface 32. The one end 35b of the through-hole 35 is on the fitted portion 33, and the other end 35a of the through-hole 35 is on the other main surface 32. In the flexible wiring portion 55, a connection terminal 56 is arranged at a location of passing through the through-hole 35 and beyond the other main surface 32 of the molded body 30. A reinforcing film 58 is provided on a surface of the flexible wiring portion 55 on the side opposite to the position where the connection terminal 56 is arranged.

(5) Method for Manufacturing Molded Article 10

As illustrated in FIG. 14, first, the flexible wiring portion 55 is connected to the circuit film 20. The opening 29 of the circuit film 20 is formed, for example, by a punching press.

Figure 15:
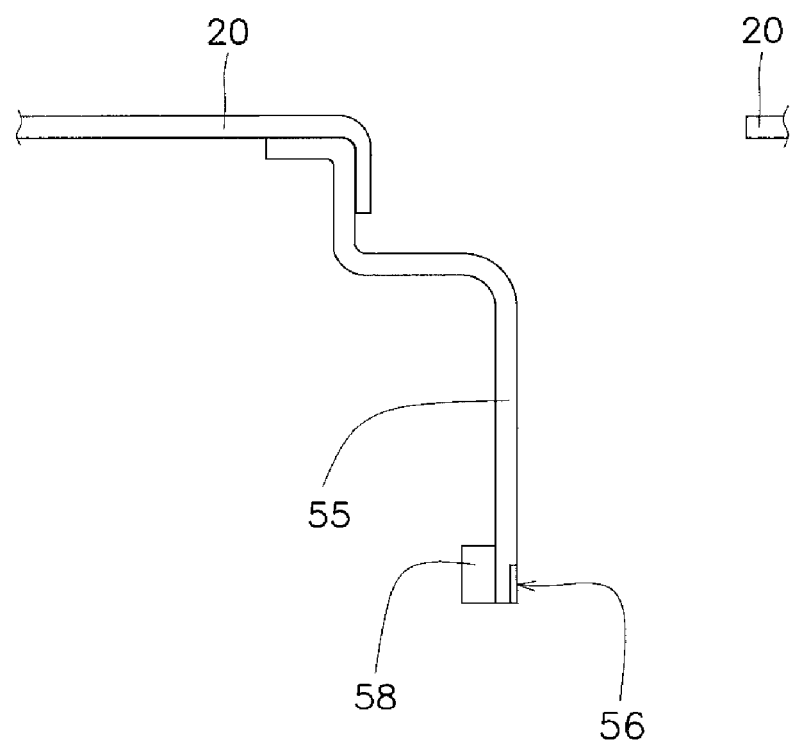
FIG. 15 is a partially enlarged cross-sectional view illustrating the flexible wiring portion connected to the circuit film.

Using the circuit film 20 and the flexible wiring portion 55 illustrated in FIG. 14, the circuit film 20 and the flexible wiring portion 55 are pre-formed. FIG. 15 illustrates the enlarged circuit film 20 and flexible wiring portion 55 after pre-forming. In pre-forming, the flat circuit film 20 and the flexible wiring portion 55 are processed into a three-dimensional shape as illustrated in FIG. 15, for example, by a hot press.

The pre-formed circuit film 20 and flexible wiring portion 55 are set in the first mold 110 (see FIG. 16) similar to the first mold 110 illustrated in FIGS. 9 and 10, for example. The flexible wiring portion 55 is arranged along a projection 11 for forming the through-hole 35 of the molded body 30.

Figure 16:
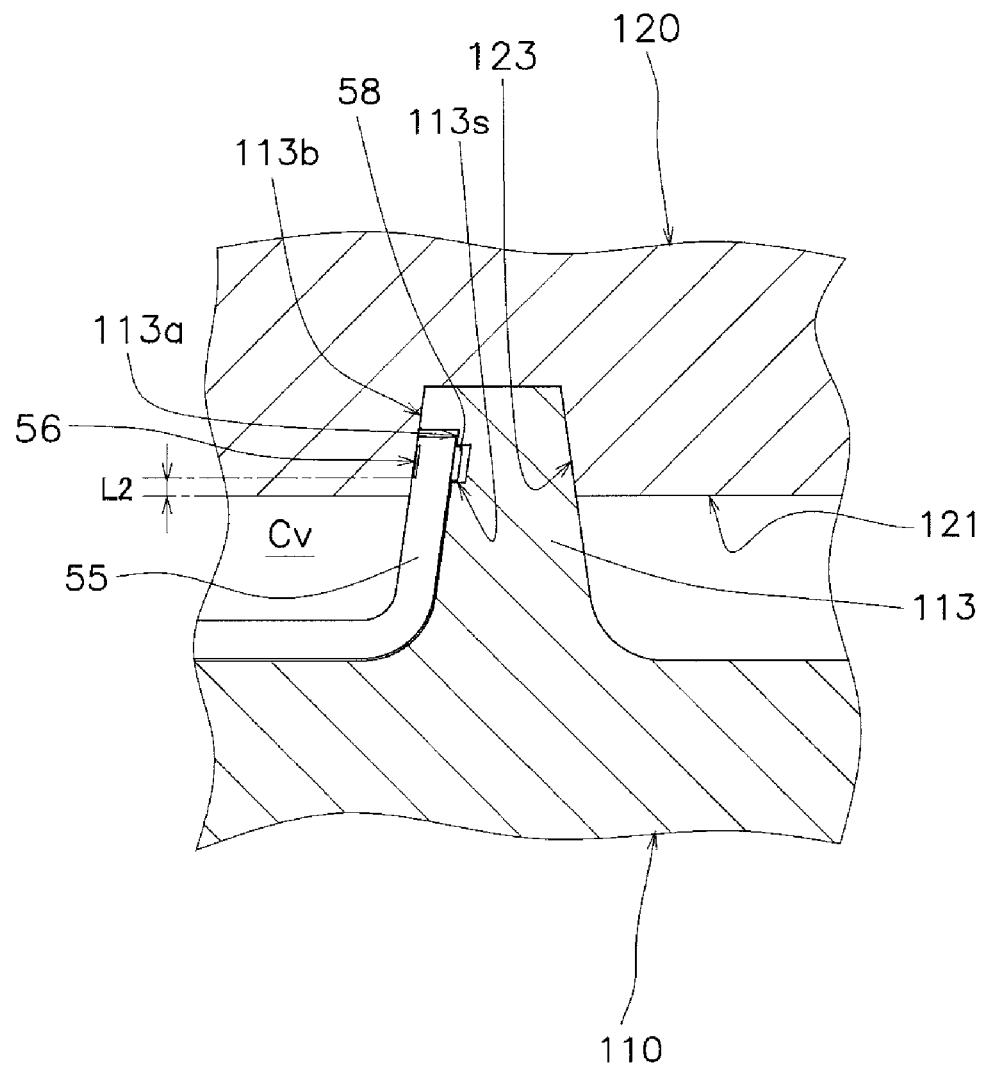
FIG. 16 is a partially enlarged cross-sectional view of a first mold and a second mold in which the circuit film and the flexible wiring portion are set.

In the circuit film 20, at least a portion of the flexible wiring portion 55 is arranged on the side surface 113a of the projection 113 of the first mold 110 illustrated in FIG. 16. Here, a distal end portion of the flexible wiring portion 55 is arranged along the side surface 113a of the projection 113. This distal end portion of the flexible wiring portion 55 is a portion including the connection terminal 56.

The periphery of the distal end portion of the flexible wiring portion 55 arranged on the side surface 113a of the projection 113 is surrounded by the rib 113b of the projection 113. The rib 113b is a portion projecting from the side surface 113a. The rib 113b prevents a molten material from entering between the side surface 113a and the flexible wiring portion 55. Note that the rib 113b may be omitted in some cases.

Next, as illustrated in FIG. 16, the first mold 110 and the second mold 120 are clamped. In this clamping step, the projection 113 of the first mold 110 fits to the recessed portion 123 of the second mold 120. By fitting the projection 113 of the first mold 110 to the recessed portion 123 of the second mold 120, the connection terminal 56 of the flexible wiring portion 55 is sandwiched between the first mold 110 and the second mold 120 in the recessed portion 123.

After clamping, the molten material is injected into the cavity Cv formed by the first mold 110 and the second mold 120. This molten material is solidified in the cavity Cv to form the molded body 30. Simultaneously with solidifying the molten material, the molded body 30, the circuit film 20, and the flexible wiring portion 55 are integrated. In the step of forming the molded body 30, the through-hole 35 is provided in the molded body 30 with the projection 113. At this time, since the distal end portion of the flexible wiring portion 55 is arranged along the side surface 113a of the projection 113, the flexible wiring portion 55 is arranged in the through-hole 35. In this way, the connection terminal 56 sandwiched between the first mold 110 and the second mold 120 does not come into contact with the molten material injected into the cavity Cv when the circuit film 20, the molded body 30, and the flexible wiring portion 55 are integrally molded. A distance L2 from the recessed portion 113s that houses the reinforcing film 58 to the inner surface 121 of the second mold 120 is preferably, for example, 2 mm or more.

Third Embodiment

(6) Overall Configuration

The molded article according to the third embodiment can also have the configuration similar to that of the molded article 10 illustrated in FIG. 1, for example. Here, description of the configuration of the molded article 10 of the third embodiment is omitted. In the first embodiment and the second embodiment, in a state where the through-hole 35 is open at the end of injection molding, the circuit film 20 and the molded body 30 are integrally molded or the circuit film 20, the molded body 30, and the flexible wiring portion 55 are integrally molded.

However, the circuit film 20 and the molded body 30 may be integrally molded or the circuit film 20, the molded body 30, and the flexible wiring portion 55 may be integrally molded at the end of injection molding so as to close the through-hole 35 of the molded body 30.

(7) Method for Manufacturing Molded Article 10

Figure 17:
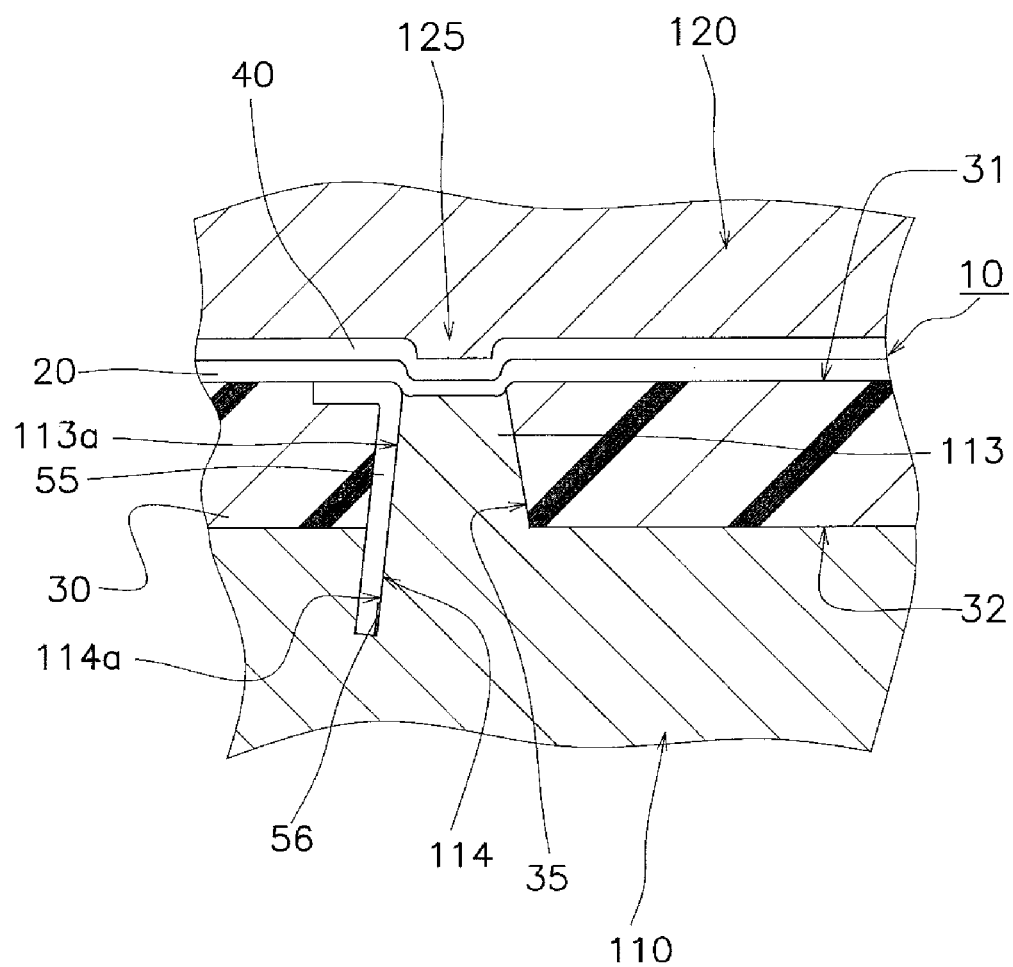
FIG. 17 is a partially enlarged cross-sectional view for describing a molded article according to a third embodiment.

FIG. 17 illustrates the molded body 30 of the molded article 10, the circuit film 20, the flexible wiring portion 55, and a design film 40 according to the third embodiment. The design film 40 covers the through-hole 35 and covers at least a portion of the circuit film 20. For example, the manufacturing step illustrated in FIG. 17 is used in the method for manufacturing the molded article 10 to gaplessly close the through-hole 35 by the design film 40.

The first mold 110 includes the projection 113 and a groove 114. The side surface 113a of the projection 113 and a side surface 114a of the groove 114 are connected. In other words, the side surfaces 113a, 114a form one smooth surface. One smooth surface is, for example, a plane or a continuous curved surface and a surface without an angular portion. In clamping, the distal end portion of the flexible wiring portion 55 is housed in the groove 114. Therefore, the connection terminal 56 at the distal end portion of the flexible wiring portion 55 does not come into contact with the molten material during injection molding.

In the second mold 120 illustrated in FIG. 17, a bulging portion 125 having a plateau shape is provided at a location facing the projection 113. The bulging portion 125 facilitates positioning of the pre-formed circuit film 20, the design film 40, and the flexible wiring portion 25. Here, the bulging portion 125 is provided, but the portion facing the projection 113 may be flat or recessed. However, in a case where the molded article 10 is completed, the portion facing the projection 113 is preferably flat to make the position of the through-hole 35 unnoticeable from the outside.

By setting and positioning the circuit film 20, the design film 40, and the flexible wiring portion 55 in the second mold 120, the flexible wiring portion 55 is guided in the groove 114 while being in contact with the side surface 113a of the projection 113 and the side surface 114a during clamping. Therefore, the side surface 113a is preferably inclined so as to be away from the other side surface facing the side surface 113a as the side surface 113a is close to the first mold 110 rather than the second mold 120. The side surface 113a is inclined by 0.5 degrees or more with respect to the movement direction of the first mold 110.

Figure 18:
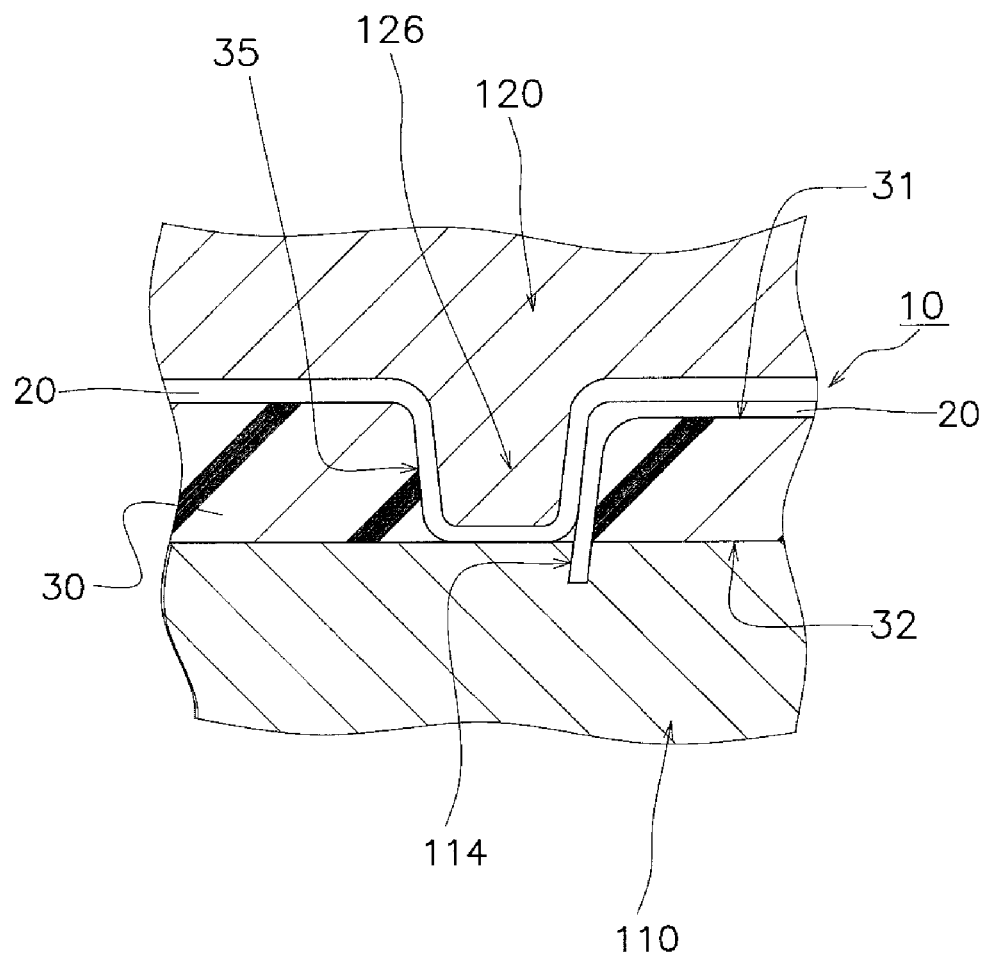
FIG. 18 is a partially enlarged cross-sectional view for describing another molded article according to the third embodiment.

While FIG. 17 illustrates the configuration in which the circuit film 20 and the flexible wiring portion 55 are separated, the molded article 10 that closes the through-hole 35 can also be formed using the circuit film 20 including the flexible wiring portion 25 as illustrated in FIG. 18. The through-hole 35 illustrated in FIG. 18 is closed by the design film 40 on the side of the other main surface 32 of the molded body 30. Therefore, the design film 40 is depressed by the through-hole 35.

For example, the manufacturing step illustrated in FIG. 18 is used in the method for manufacturing the molded article 10 to gaplessly close the through-hole 35 by the design film 40. The first mold 110 has the groove 114, and the second mold 120 has a projection 126. In clamping, the distal end portion of the flexible wiring portion 25 is housed in the groove 114. Therefore, the connection terminal 26 at the distal end portion of the flexible wiring portion 55 does not come into contact with the molten material during injection molding.

By setting and positioning the circuit film 20 and the design film 40 in the second mold 120, the flexible wiring portion 25 is guided in the groove 114 during clamping.

Figure 19A:
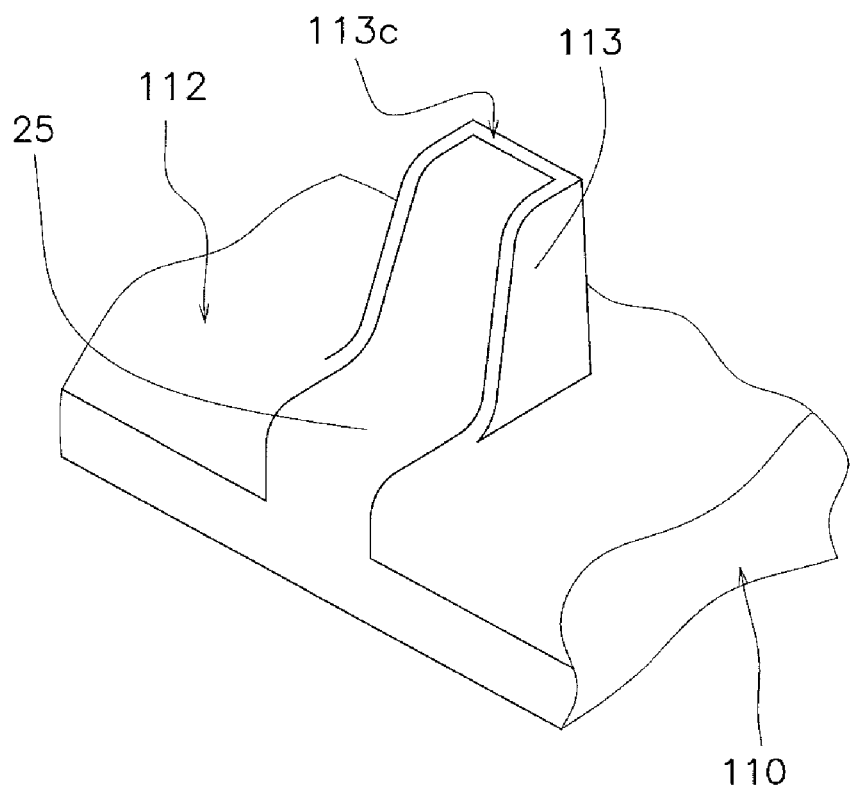
FIG. 19A is a partially enlarged perspective view of another projection in which a circuit film is set.
Figure 19B:
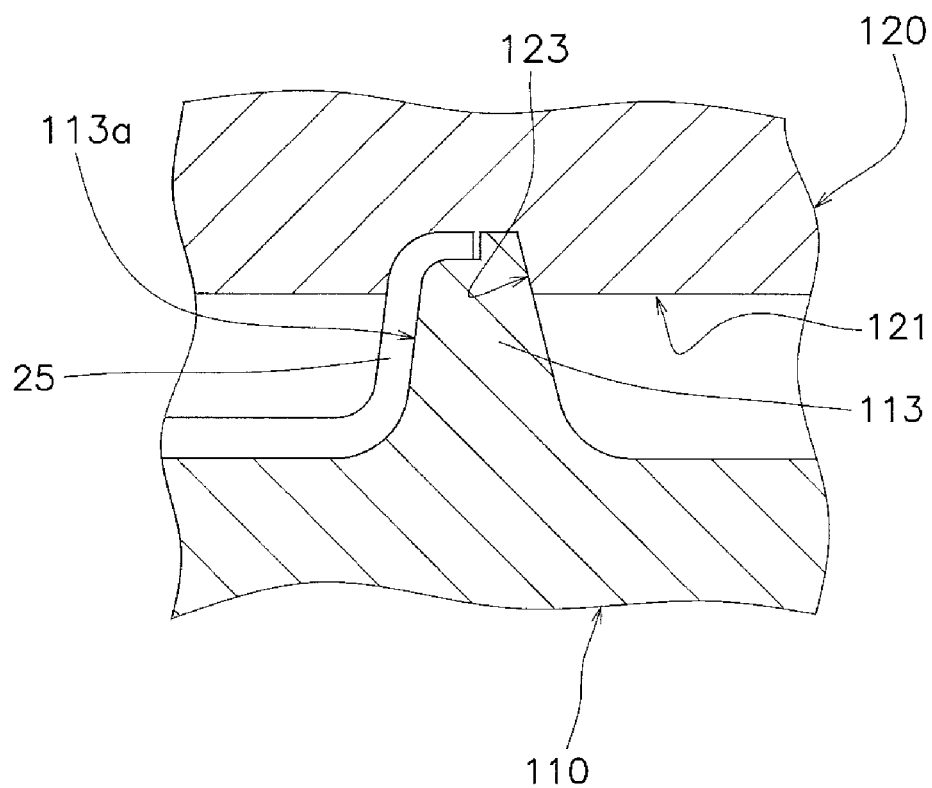
FIG. 19B is a partially enlarged cross-sectional view of another first mold and another second mold in which the circuit film is set.
Figure 20A:
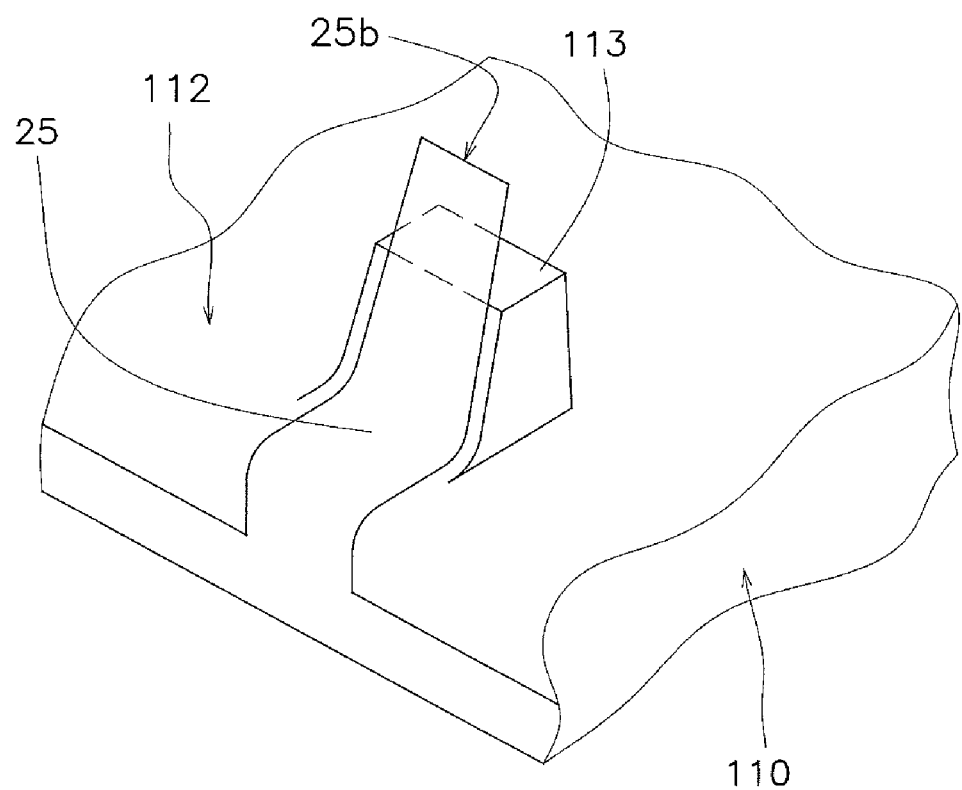
FIG. 20A is a partially enlarged perspective view of another projection in which the circuit film is set.
Figure 20B:
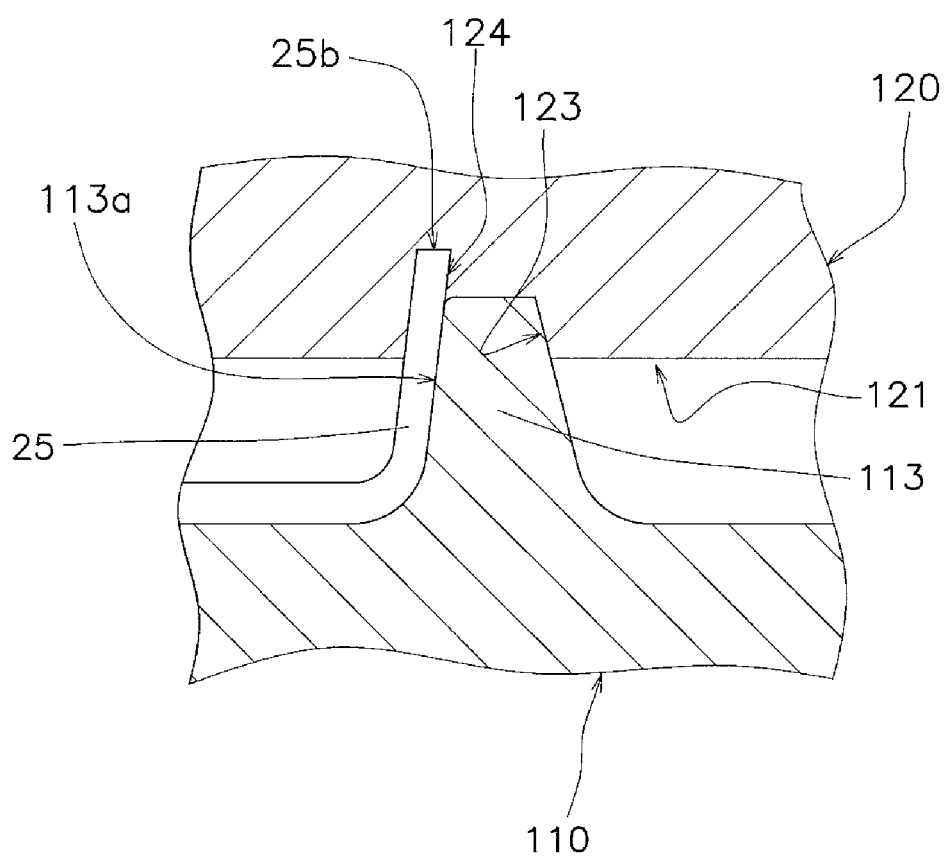
FIG. 20B is a partially enlarged cross-sectional view of other first mold and second mold in which the circuit film is set.

(8) Modified Examples (8-1)
The method of causing the flexible wiring portion 25 to run along the projection 113 for injection molding described in the first embodiment is not limited to the method illustrated in FIGS. 10 and 11. For example, as illustrated in FIGS. 19A and 19B, the flexible wiring portion 25 may be arranged up to an upper surface 113c of the projection 113. As illustrated in FIGS. 20A and 20B, the flexible wiring portion 25 may be caused to run along the side surface 113a of the projection 113 such that a distal end 25b of the flexible wiring portion 25 protruding from the projection 113 is housed in a groove portion 124 of the second mold 120. As for the flexible wiring portion 55 of the second embodiment as well, the method same as the method of causing the projection 113 of the flexible wiring portion 25 to run along similar to the first embodiment can be employed.

Note that FIGS. 19A and 19B and FIGS. 20A and 20B illustrate the flexible wiring portion 25 without a reinforcing film, but a recessed portion that houses a reinforcing film may be provided in the projection 113, and the reinforcing film may be provided on the flexible wiring portion 25.

Figure 21:
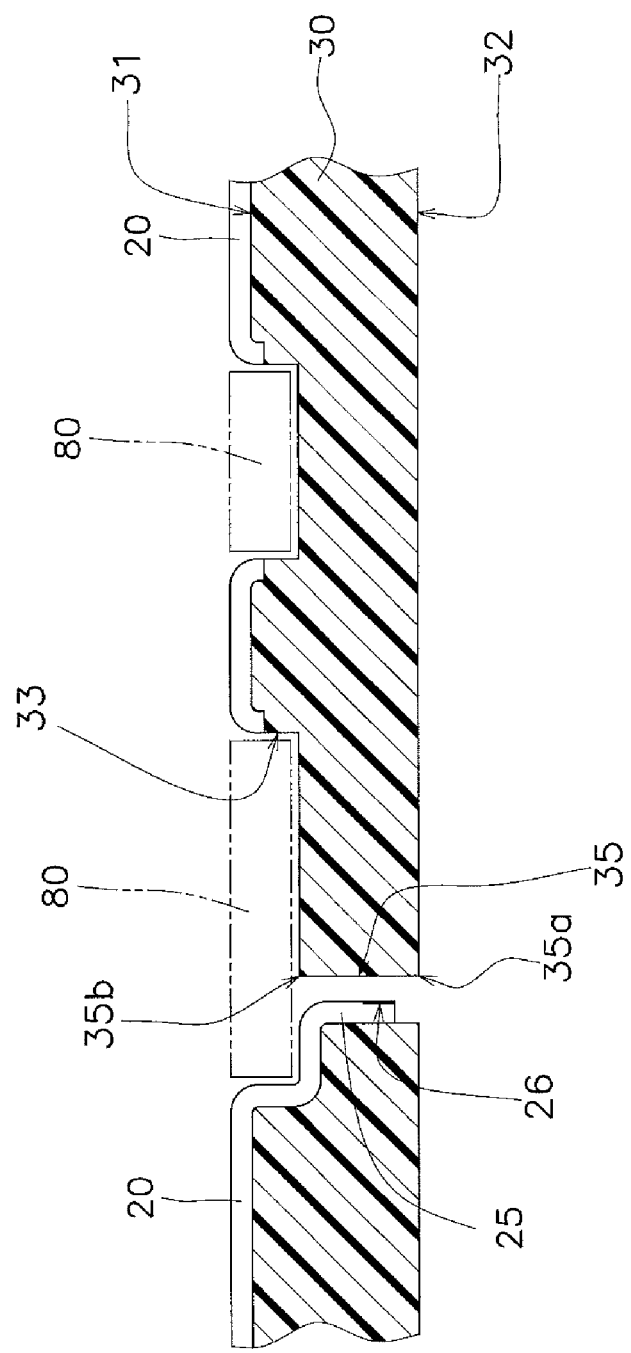
FIG. 21 is a partially enlarged perspective view enlarging a through-hole and a periphery thereof of a molded article of the second embodiment.
Figure 22A:
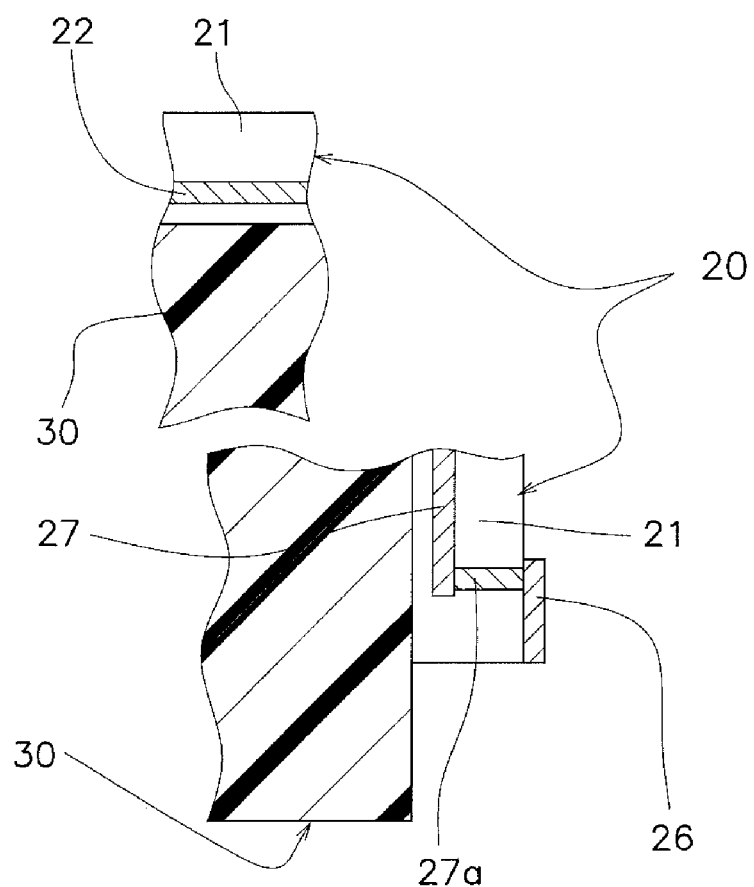
FIG. 22A is a partially enlarged cross-sectional view for describing a relationship between arrangement of a connection terminal and a through hole.
Figure 22B:
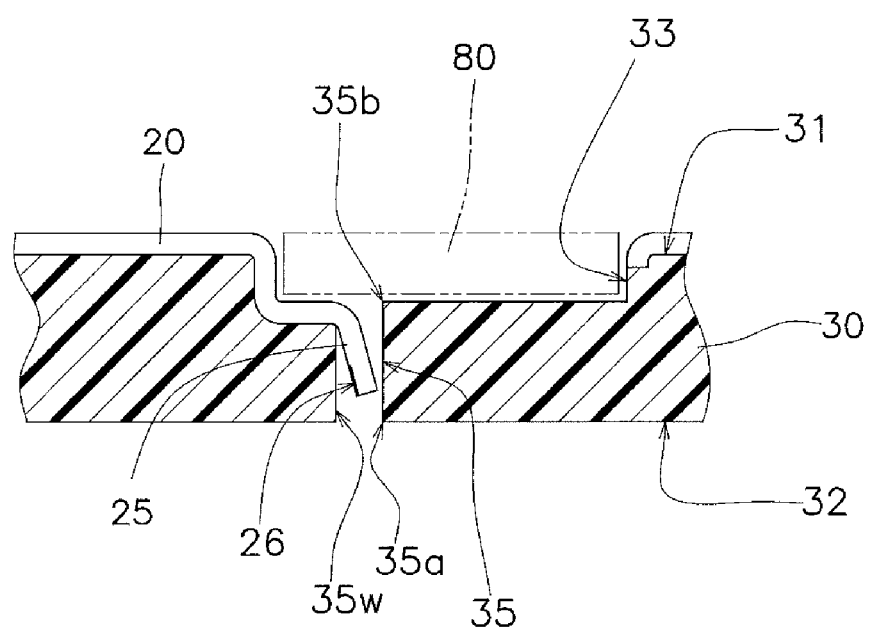
FIG. 22B is a partially enlarged cross-sectional view illustrating another example of a connection terminal arranged in the through-hole.

(8-2)
In the first embodiment, in the flexible wiring portion 25, the connection terminal 26 is arranged at a location of passing through the through-hole 35 and beyond the other main surface 32 of the molded body 30. However, as illustrated in FIG. 21, the connection terminal 26 of the flexible wiring portion 25 may be arranged in the through-hole 35. When configured in this manner, the molded article 10 has a configuration in which the electrical circuit 22 is interposed between the molded body 30 and the insulating film 21 when the molded article 10 is arranged in the order of the molded body 30, the electrical circuit 22, and the insulating film 21 from the inside to the outside. In this case, for example, as illustrated in FIG. 22A, the connection terminal 26 is formed on the outer surface of the circuit film 20, and the wiring line 27 and the connection terminal 26 are connected with a through hole 27a. Note that when the flexible wiring portion 25 is provided away from the wall surface 35w of the through-hole 35, as illustrated in FIG. 22B, the connection terminal 26 may be provided so as to be opposed to the wall surface 35w without providing the through hole.

Figure 23A:
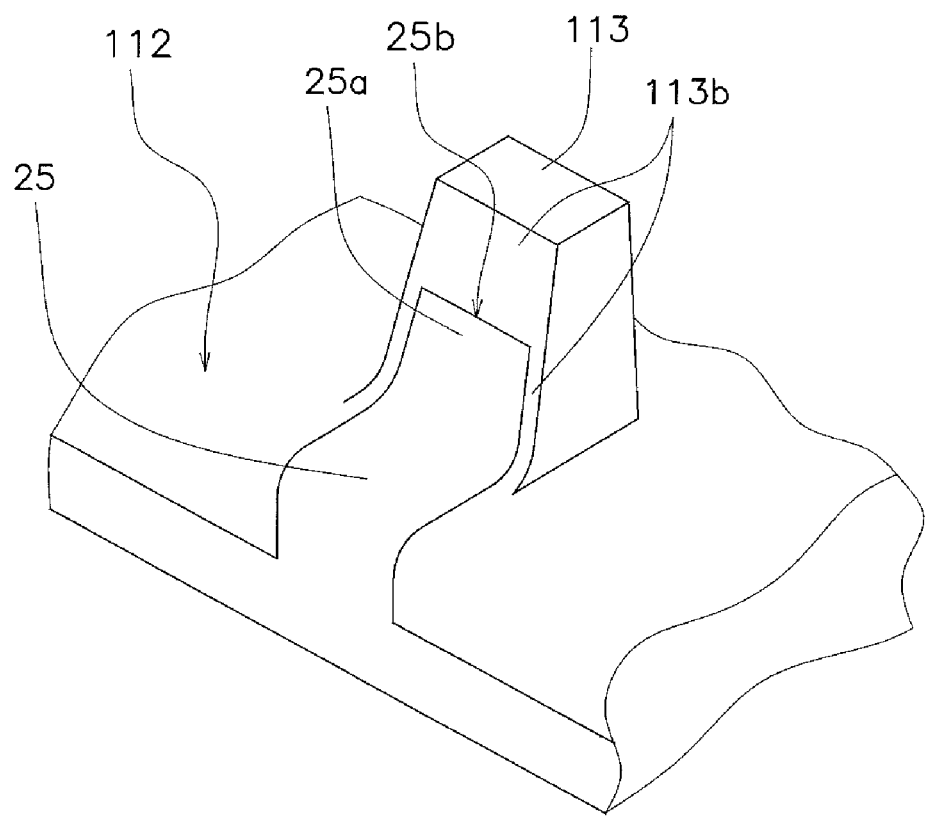
FIG. 23A is a partially enlarged perspective view of a projection of the first mold of a modified example in which the circuit film is set.
Figure 23B:
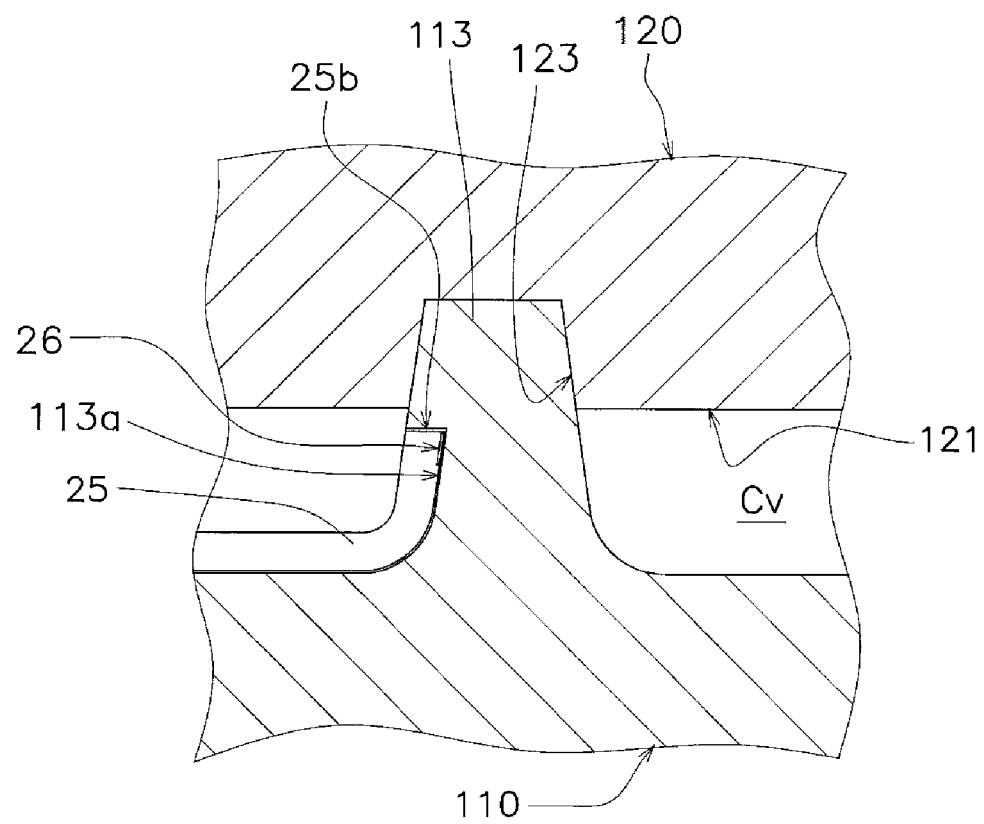
FIG. 23B is a partially enlarged cross-sectional view of a first mold and a second mold of a modified example in which the circuit film is set.

In this case as well, for injection molding described in the first embodiment, the flexible wiring portion 25 is caused to run along the side surface 113a of the projection 113. For example, as illustrated in FIGS. 23A and 23B, the flexible wiring portion 25 of the circuit film 20 is set to the projection 113 such that the distal end 25b of the flexible wiring portion 25 does not reach the inner surface 121 of the second mold 120. At this time, the connection terminal 26 of the flexible wiring portion 25 is brought into abutment with the side surface 113a. When the connection terminal 26 comes into abutment with the side surface 113a, the molten material does not come into contact with the connection terminal 26 when the circuit film 20 and the molded body 30 are integrally molded.

As described above, the point that it can be configured that the flexible wiring portion 25 is arranged in the through-hole 35 such that the flexible wiring portion 25 does not protrude to the side of the other main surface 32 of the molded body 30 is similarly possible to the flexible wiring portion 55. In the case where the flexible wiring portion 55 is arranged and fixedly secured in the through-hole 35 as well, the connection terminal 56 is arranged on the side opposite to the wall surface 35w using the through hole. In a case where the flexible wiring portion 55 includes wiring lines on both sides as well, the wiring line on one surface is connected to the connection terminal 56 on the other side using the through hole.

Figure 24:
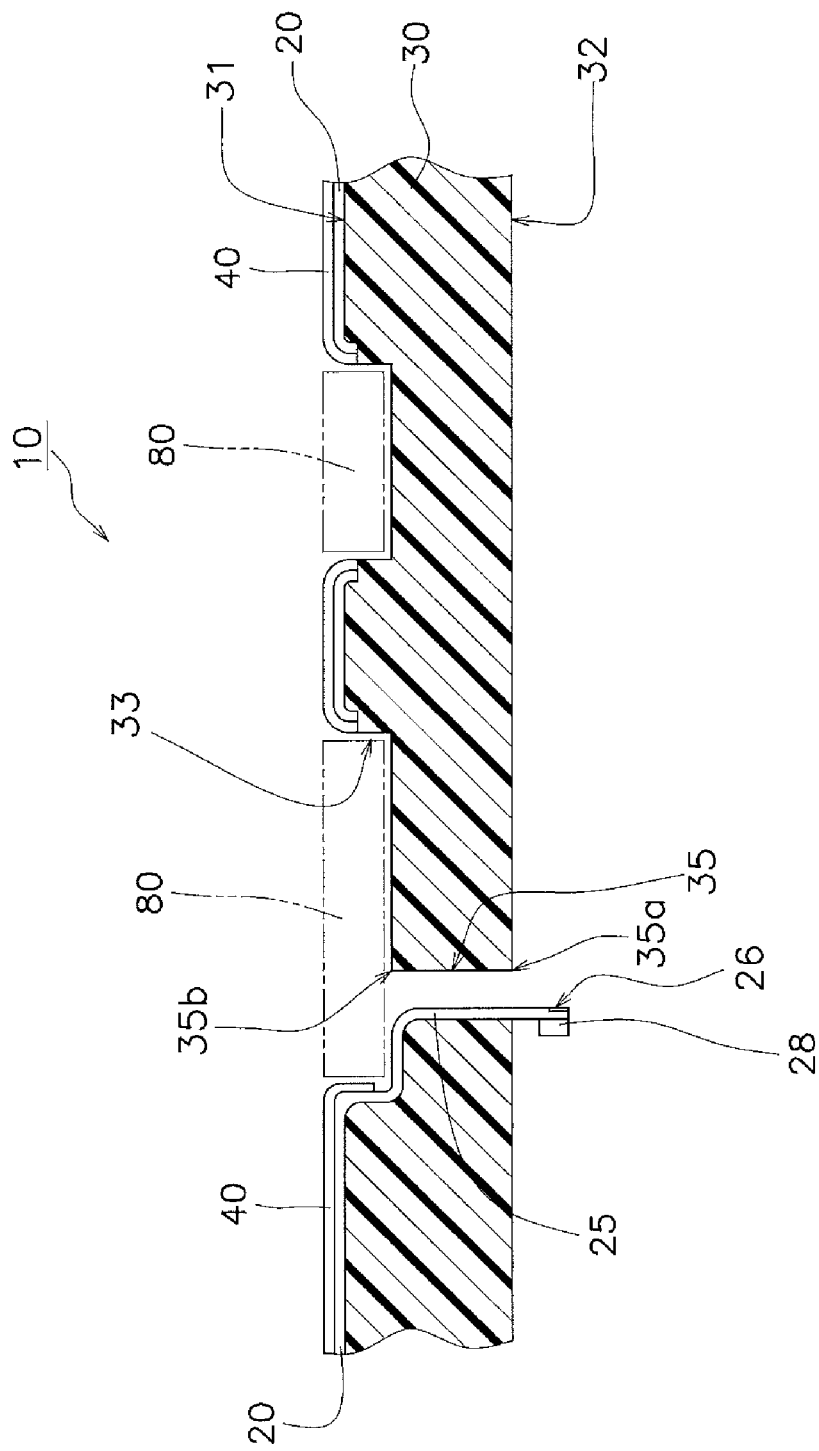
FIG. 24 is a partially enlarged perspective view enlarging a through-hole and a periphery thereof of a molded article according to a modified example.

(8-3)
In the first embodiment and the second embodiment, the case where the circuit film 20 is exposed to the surface of the molded article 10 has been described. However, the circuit film 20 can be configured so as not to be exposed to the surface of the molded article 10. As illustrated in FIG. 24, the design film 40 may be provided on the outer surface side of the molded body 30. In this modified example, the design film 40 is provided outside the molded article 10. The design film 40 includes, for example, a film made of the material same as the insulating film 21 and a design layer printed on the film. The design layer can be printed, for example, using a material similar to the graphic layer. Fine irregularities may be formed on the surface of the design film 40. An adhesive layer is preferably provided between the design film 40 and the circuit film 20.

In the circuit film 20 illustrated in FIG. 24, the electrical circuit 22 is arranged on the side opposite to the side where the molded body 30 is present with the insulating film 21 interposed therebetween. Note that the molded article 10 that does not include the design film 40 as in the first embodiment may also be configured such that the electrical circuit 22 is arranged on the side opposite to the side where the molded body 30 is present with the insulating film 21 interposed therebetween. The electrical circuits 22 may be formed on both sides of the insulating film 21.

In the method for manufacturing a molded article illustrated in FIG. 24, for example, during the pre-forming of the first embodiment, the circuit film 20 and the design film 40 may be stacked and molded, and the circuit film 20 and the design film 40 may be adhered. The circuit film 20 and the design film 40 are both set in the first mold 110.

Alternatively, the circuit film 20 and the design film 40 may be individually pre-formed. The individually pre-formed circuit film 20 and design film 40 are stacked and set. During integral molding of the circuit film 20 and the molded body 30, the circuit film 20 and the design film 40 are adhered.

Figure 25:
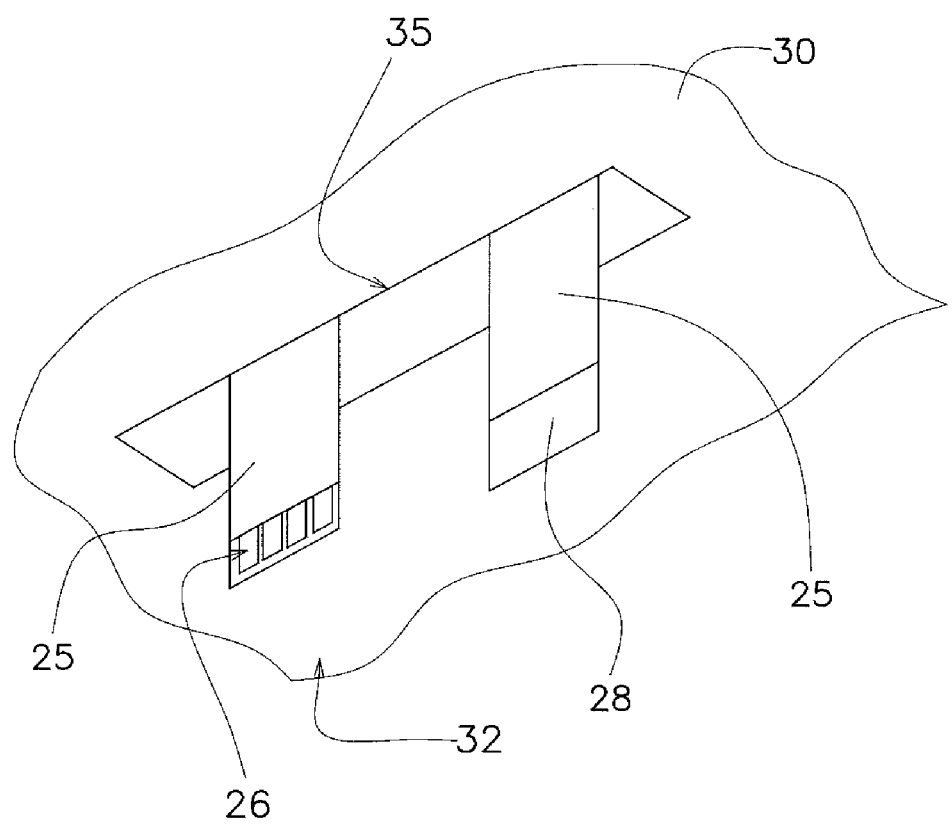
FIG. 25 is a partially enlarged perspective view illustrating a plurality of flexible wiring portions arranged in one through-hole.

(8-4)
The case in which only one flexible wiring portion 25 is arranged in the through-hole 35 in the molded article 10 of the first embodiment has been described. However, the number of flexible wiring portions 25 arranged in the through-hole 35 is not limited to one and may be plural. For example, as illustrated in FIG. 25, the two flexible wiring portions 25 can be arranged in the through-hole 35. In this case, for example, one flexible wiring portion 25 may be arranged on each of both opposed side surfaces of a projection to form the through-hole 35 so as to run along, or the two flexible wiring portions 25 may be arranged on the same side surface so as to run along.

A plurality of the flexible wiring portion 55 of the second embodiment may be arranged in the through-hole 35 similarly to the flexible wiring portions 25 of the first embodiment. The plurality of the flexible wiring portions 25, 55 of the third embodiment may be arranged in the through-hole 35 similarly to the flexible wiring portions 25 of the first embodiment.

(8-5)

In the first embodiment, a character plate having the N-shape separated from the molded body 30 has been described as an example of the three-dimensional component 80 covering the through-hole 35. However, in addition to use of the three-dimensional component as a cover of the through-hole, as illustrated in FIGS. 26 and 27, a three-dimensional component 85 may be arranged in the through-hole 35.

Figure 26:
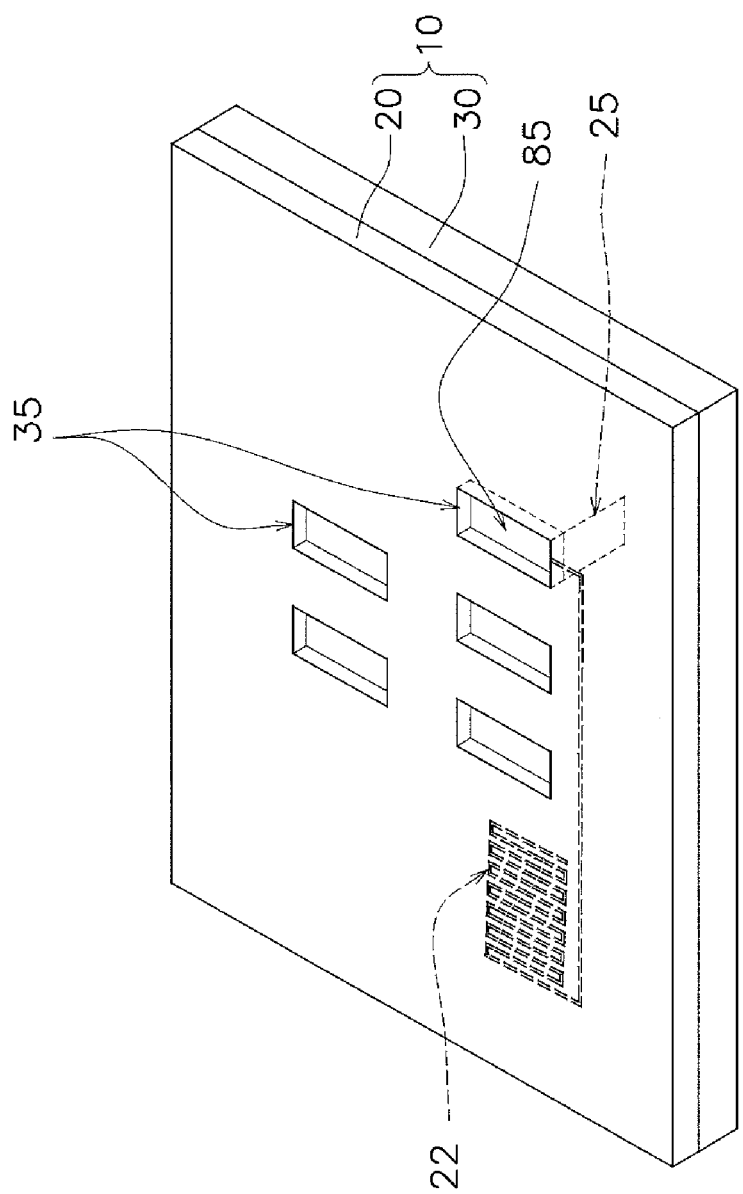
FIG. 26 is a partially enlarged perspective view illustrating a three-dimensional component and a through-hole according to a modified example.
Figure 27:
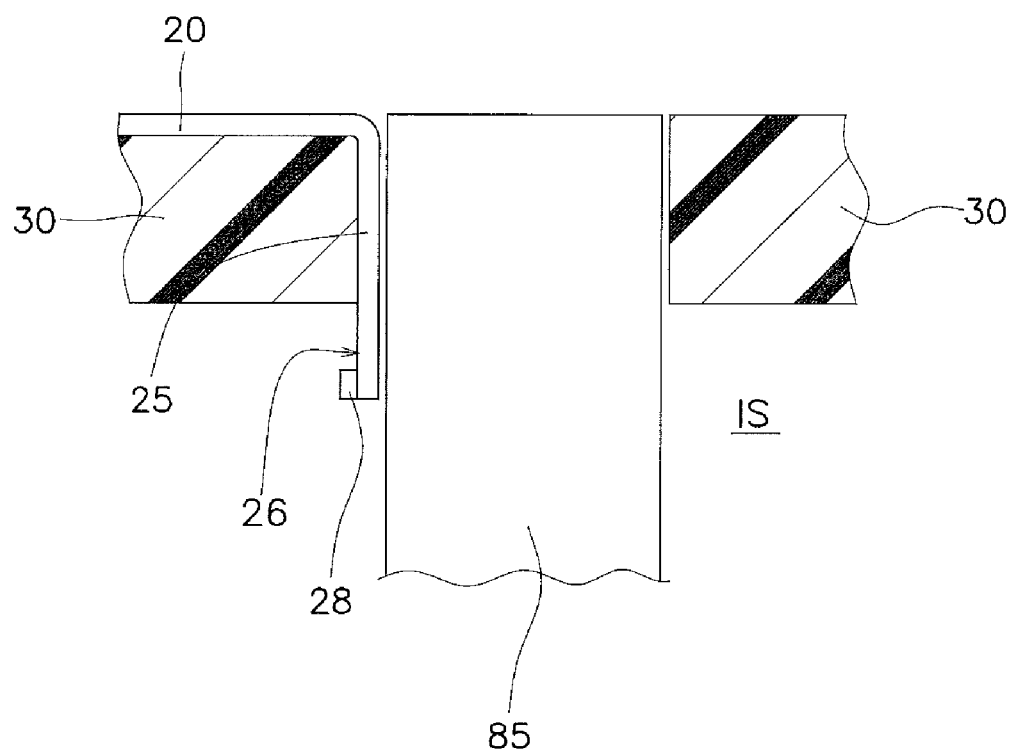
FIG. 27 is a partially enlarged cross-sectional view illustrating a three-dimensional component and a through-hole according to a modified example.

FIG. 26 illustrates the five through-holes 35 formed in the molded article 10. The four through-holes 35 among these five through-holes 35 are used as openings for a speaker, for example. The remaining one is used as an opening for indicating that the speaker is activated by light, for example. To guide the light in this case, the three-dimensional component 85, which is a light guide member, is arranged in the through-hole 35. The three-dimensional component 85, which is the light guide member, extends toward an interior space IS of the molded article 10 surrounded by the molded body 30. The electrical circuit 22 is used, for example, for an antenna. The flexible wiring portion 25 for connection of the electrical circuit 22 passes through the through-hole 35 in which the three-dimensional component 85 is arranged and extends to the interior space IS of the molded article 10.

In the molded articles 10 of the second embodiment and the third embodiment as well, the three-dimensional components can be arranged in the through-holes 35.

(8-6)

Figure 28:
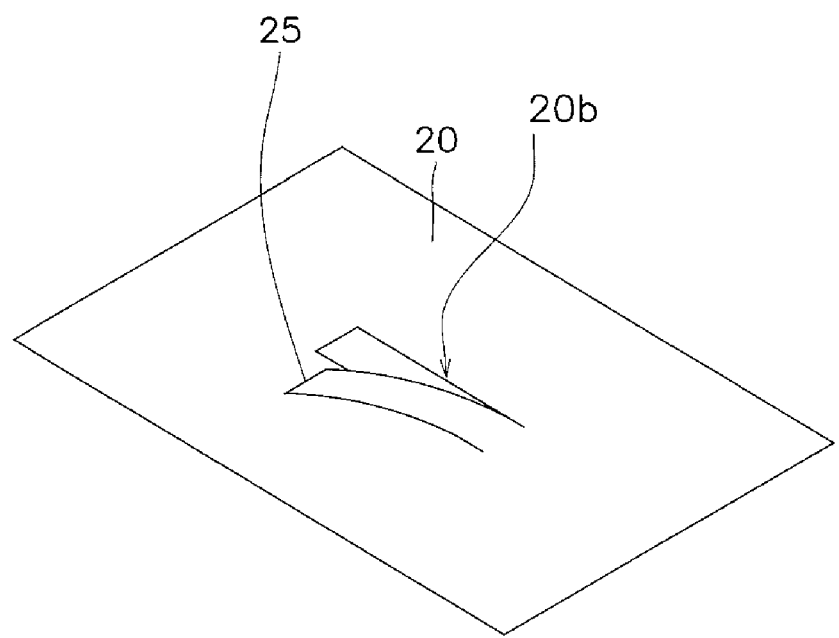
FIG. 28 is a partially enlarged perspective view illustrating a flexible wiring portion according to a modified example.

In the first embodiment, as the formation method of the flexible wiring portion 25, the case where the insulating film 21 around the wiring line 27 is punched out to remove the insulating film 21 around the wiring line 27 is described. However, for example, as illustrated in FIG. 28, the insulating film 21 around the wiring line 27 may be cut at a cutting line 20b around the wiring line 27 to form the flexible wiring portion 25.

(8-7)

In the first embodiment, the second embodiment, and the third embodiment, the case in which the electrical circuit 22 is the antenna has been described as an example. However, the electrical circuit 22 is not limited to an antenna. The electrical circuit 22 other than the antenna includes, for example, a sensor, such as a touch sensor, a heater, a display device, such as a liquid crystal display, and an input device, such as a membrane switch.

The electrical device 90 is not limited to having a function to perform transmission and reception using the antenna. Examples of the electrical device include a detection device connected to a sensor, a drive device for a heater, a drive device for a display device, and a reception device of a signal input from an input device.

(8-8)

In the first embodiment, the second embodiment, and the third embodiment, the case where the flexible wiring portion 25, 55 is fixedly secured to the wall surface 35w of the through-hole 35 has been described. However, the flexible wiring portion 25, 55 may be provided so as not to be fixedly secured to the wall surface 35w of the through-hole 35. In other words, the flexible wiring portion 25, 55 is not fixed to the wall surface 35w of the through-hole 35 but may be freely separated.

When the flexible wiring portion 25, 55 is provided so as not to be fixed to the wall surface 35w of the through-hole 35, for example, an adhesive is not provided to a portion in the through-hole 35 of the flexible wiring portion 25, 55 and integral molding may be performed such that the flexible wiring portion 25, 55 does not adhere to the wall surface 35w. For example, a release film may be arranged between the flexible wiring portion 25, 55 and the wall surface 35w and integral molding may be performed to allow separating the flexible wiring portion 25, 55 from the wall surfaces 35w.

(9) Features (9-1)

The molded article 10 of the first embodiment, the second embodiment, or the third embodiment includes the circuit film 20 on the one main surface 31 of the molded body 30. The molded body 30 includes the flexible wiring portion 25, 55 that passes through the through-hole 35 from the one main surface 31 to the other main surface 32. When the electrical device 90 is connected to the connection terminal 26, 56 of the flexible wiring portion 25, 55, the circuit film 20 on the side of the one main surface 31 of the molded body 30 and the electrical device 90 on the side of the other main surface 32 can be connected by the flexible wiring portion 25, 55 passing through the through-hole 35. By allowing layout of the flexible wiring portion 25 passing through the through-hole 35, damage to the wiring line 27 due to an interference of the flexible wiring portion 25, 55 with the molded body 30 or layout of bending of the flexible wiring portion 25, 55 can be prevented.

(9-2)

The molded article 10 of the first embodiment, the second embodiment, or the third embodiment may include the three-dimensional component 85 (see FIG. 26) separated from the molded body 30 and arranged in the through-hole 35. With the molded article 10 configured in this manner, the three-dimensional component 85 shares the through-hole 35 with the flexible wiring portion 25, 55, and therefore reduction in strength of the molded article 10 is suppressed compared to a case where a dedicated hole is separately provided for the three-dimensional component 85.

(9-3)

The molded article 10 of the first embodiment or the second embodiment may include the three-dimensional component 80, which is separated from the molded body 30 and covers the through-hole 35. The molded article 10 configured in this manner covers and hides the through-hole 35 with the three-dimensional component 80, thus improving the designability of appearance. Closing the through-hole 35 with the three-dimensional component 80 allows preventing a foreign matter, such as dust and water content, from entering the side of the other main surface 32 of the molded body 30 through the through-hole 35.

(9-4)

In the molded article 10 of the first embodiment, the second embodiment, or the third embodiment, the flexible wiring portion 25, 55 is fixedly secured to the wall surface 35w of the through-hole 35. In the molded article 10 configured in this manner, the change in position of the flexible wiring portion 25, 55 is suppressed compared to the case where the flexible wiring portion 25, 55 is not fixedly secured to the wall surface 35w of the through-hole 35. As a result, an external device, such as the electrical device 90, can be easily connected to the connection terminal 26, 56 of flexible wiring portion 25, 55.

(9-5)

The electrical product 5 described above can connect the electrical device 90 inside the housing and the electrical circuit 22 by the flexible wiring portion 25, 55 passing through the through-hole 35 of the molded article 10 from the one main surface 31 of the molded article 10 facing outside the housing. In the first embodiment, the second embodiment, or the third embodiment, the molded article 10 itself including the temples 2, the tips 3, and the hinges 4 of the eyeglasses 1 is a housing. In the electrical product 5, a defect, such as an interference of the flexible wiring portion 25, 55 with the housing and bending of the flexible wiring portion 25, 55, due to layout of the flexible wiring portion 25, 55 can be prevented. Note that the molded article 10 may be integrated with another member to constitute an electrical product. Additionally, the molded article 10 may be a component of the housing.

(9-6)

For the method for manufacturing the molded article 10 of the first embodiment or the second embodiment, the case where the electrical device 90 is connected to the connection terminal 26, 56 of the flexible wiring portion 25, 55 is considered. In such a case, the flexible wiring portion 25, 55 that connects the circuit film 20 on the one side of the through-hole 35 of the molded article 10 and the electrical device 90 on the other side of the through-hole 35 can be arranged in the through-hole 35. Furthermore, during integral molding of the circuit film 20 and the molded body 30, since the molten material does not come into contact with the connection terminal 26, 56 of the flexible wiring portion 25, 55, poor connection between the circuit film 20 and the electrical device 90 due to poor connection in the connection terminal 26, 56 can be suppressed.

Although the embodiments of the present invention have been described above, the present invention is not limited to the above-described embodiments, and various changes are possible without departing from the gist of the invention. In particular, the plurality of embodiments and modified examples described herein can be combined arbitrarily with one another as necessary.

REFERENCE SIGNS LIST

5 Electrical product
10 Molded article
20 Circuit film
21 Insulating film
22 Electrical circuit
25, 55 Flexible wiring portion
26, 56 Connection terminal
27 Wiring line
30 Molded body
35 Through-hole
35w Wall surface
40 Design film
80, 85 Three-dimensional component

The invention claimed is:

1. A molded article, comprising:
a circuit film that includes a thermoplastic insulating film and an electrical circuit formed on the insulating film; and
a molded body having a first main surface and a second main surface opposed to the first main surface, the molded body being integrally molded with the circuit film located on the first main surface, wherein
the circuit film includes a flexible wiring portion in which a wiring line connected to the electrical circuit is formed,
the molded body has a through-hole that penetrates from the first main surface to the second main surface, and
in the flexible wiring portion, a first flexible wiring portion surface is arranged so as to run along a wall surface of the through-hole and a second flexible wiring portion surface is arranged such that a clearance is formed between the second flexible wiring portion surface and the wall surface of the through-hole, and a connection terminal is arranged in the through-hole or at a position of passing through the through-hole and beyond the second main surface.

2. A molded article, comprising:
a circuit film that includes a thermoplastic insulating film and an electrical circuit formed on the insulating film; and
a thermoplastic flexible wiring portion formed of a flexible printed board, separated from the circuit film, and connected to the electrical circuit; and
a molded body having a first main surface and a second main surface opposed to the first main surface, the molded body being integrally molded with both of the circuit film located on the first main surface and the flexible wiring portion,
wherein
the molded body has a through-hole that penetrates from the first main surface to the second main surface, and
in the flexible wiring portion, a first flexible wiring portion surface is arranged so as to run along a wall surface of the through-hole and a second flexible wiring portion surface is arranged such that a clearance is formed between the second flexible wiring portion surface and the wall surface of the through-hole, and a connection terminal is arranged in the through-hole or at a position of passing through the through-hole and beyond the second main surface.

3. The molded article according to claim 1, further comprising
a three-dimensional component arranged in the through-hole and separated from the molded body.

4. The molded article according to claim 1, further comprising
a three-dimensional component that covers the through-hole and is separated from the molded body.

5. The molded article according to claim 1, further comprising
a design film that covers the through-hole and covers at least a portion of the circuit film, the design film being integrally molded with the molded body.

6. The molded article according to claim 1, wherein
the flexible wiring portion is fixedly secured to a wall surface of the through-hole.

7. An electrical product, comprising:
a chassis including the molded article according to claim 1; and an electrical device arranged in the chassis and connected to the connection terminal of the flexible wiring portion, wherein the molded article is mounted with the first main surface facing an outside of the chassis and the second main surface facing an inside of the chassis.

8. A method for manufacturing a molded article, the method comprising:
  (a) pre-forming a circuit film that includes a thermoplastic insulating film and an electrical circuit formed on the insulating film;
  (b) setting the circuit film in a first mold;
  (c) clamping the first mold and a second mold; and
  (d) injecting a molten material into a cavity of the first mold and the second mold to form a molded body integrally molded with the circuit film,
  wherein
  in (a), a thermoplastic flexible wiring portion or the thermoplastic flexible wiring portion separate from the circuit film in which a wiring line connected to the electrical circuit is formed is stood in a direction intersecting with an in-plane direction of the circuit film;
  in (b), at least a portion of the flexible wiring portion is arranged on a side surface of a projection of the first mold;
  in (c), the projection of the first mold is fitted to a recessed portion of the second mold, and a connection terminal of the flexible wiring portion is sandwiched between the first mold and the second mold in the recessed portion; and
  in (d), a through-hole is provided in the molded body with the projection and the circuit film and the molded body are integrally molded such that the flexible wiring portion is arranged in the through-hole without the connection terminal in contact with the molten material.

9. The molded article according to claim 1, wherein the connection terminal is arranged on the first flexible wiring portion surface at the position of the flexible wiring portion passing through the through-hole.

10. The molded article according to claim 9, further comprising a reinforcing film provided on the second flexible wiring portion surface opposite the connection terminal.

11. The molded article according to claim 1, wherein the connection terminal is arranged on the second flexible wiring portion surface at the position of the flexible wiring portion passing through the through-hole.

12. The molded article according to claim 11, further comprising a reinforcing film provided on the first flexible wiring portion surface opposite the connection terminal.

13. The molded article according to claim 2, wherein the connection terminal is arranged on the first flexible wiring portion surface at the position of the flexible wiring portion passing through the through-hole.

14. The molded article according to claim 2, wherein the connection terminal is arranged on the second flexible wiring portion surface at the position of the flexible wiring portion passing through the through-hole.

15. The molded article of claim 1, further comprising a fitted portion formed on the first main surface of the molded body, wherein the through-hole is arranged within an inside surface of the fitted portion.

16. The molded article of claim 2, further comprising a fitted portion formed on the first main surface of the molded body, wherein the through-hole is arranged within an inside surface of the fitted portion.

17. The method of claim 8, wherein the flexible wiring portion includes a reinforcing film opposite the connection terminal within the recessed portion.

18. The method of claim 17, further comprising arranging the reinforcing film to be a distance within the recessed portion from an inner surface of the second mold.

* * * * *